United States Patent
Kawamoto

(10) Patent No.: US 6,760,889 B2
(45) Date of Patent: Jul. 6, 2004

(54) METHOD FOR CONVERTING A LOGIC CIRCUIT MODEL

(75) Inventor: Isao Kawamoto, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/180,297

(22) Filed: Jun. 27, 2002

(65) Prior Publication Data

US 2003/0005393 A1 Jan. 2, 2003

(30) Foreign Application Priority Data

Jul. 2, 2001 (JP) .................................... 2001-200446

(51) Int. Cl.[7] .............................................. G06F 17/50
(52) U.S. Cl. ................................................ 716/3; 716/18
(58) Field of Search .................................. 716/3, 18

(56) References Cited

U.S. PATENT DOCUMENTS

| 5,541,849 A | 7/1996 | Rostoker et al. |
| 5,870,588 A | 2/1999 | Rompaey et al. |
| 5,960,182 A | * 9/1999 | Matsuoka et al. ............ 703/17 |

FOREIGN PATENT DOCUMENTS

| JP | 10-187789 | 7/1998 |
| JP | 11-96196 | 4/1999 |
| JP | 2001-22808 | 1/2001 |

* cited by examiner

*Primary Examiner*—Vuthe Siek
*Assistant Examiner*—Chuong Anh Luu
(74) *Attorney, Agent, or Firm*—McDermott, Will & Emery

(57) ABSTRACT

The states of a logic circuit block are set as operation start states and operation end states. An instruction to be analyzed is selected from input/output instruction information. An input signal corresponding to the selected instruction is applied to an RT (Register Transfer)-level model that is in the operation start state. Then, the input signal value applied to the RT-level model is changed. In order to extract operation of the logic circuit block, the RT-level model is analyzed until it reaches the operation end state. An operation model of the logic circuit block is produced based on the extracted operations. In this way, the model of the logic circuit block specifically described at RT level can be converted into a high abstraction-level model including no concept of time.

11 Claims, 24 Drawing Sheets

FIG. 2

```
1   module sample1(in, sel, din, dout, oe1, oe2, clk);
2   input  in, sel, din, clk;
3   output dout, oe1, oe2;
4   reg    d_out, oe1, oe2, ff_in;
5   always @(posedge clk)begin
6     if ( (in == 1) && (ff_in == 0) ) begin
7        dout <= din;
8     end
9     ff_in    <= in;
10    oe1      <= sel ? 1'b0:ff_in;
11    oe2      <= sel ? ff_in:1'b0;
12  end
13  endmodule
```

FIG. 3

| function | port | type | |
|----------|------|--------|------|
| in()     | in   | high   | ···3a |
| sel()    | sel  | change | ···3b |
| din()    | din  | change | ···3c |
| dout()   | dout | change | ···3d |
| oe1()    | oe1  | high   | ···3e |
| oe2()    | oe2  | high   | ···3f |
| CLOCK    | clk  |        | ···3g |

FIG. 7

| in | sel | din | dout | ff_in | oe1 | oe2 | |
|----|-----|-----|------|-------|-----|-----|----|
| 0 | 0 | 0 | 0 | 0 | 0 | 0 | ···7a |
| 0 | 0 | 0 | 1 | 0 | 0 | 0 | ···7b |
| 0 | 0 | 1 | 0 | 0 | 0 | 0 | ···7c |
| 0 | 0 | 1 | 1 | 0 | 0 | 0 | ···7d |
| 0 | 1 | 0 | 0 | 0 | 0 | 0 | ···7e |
| 0 | 1 | 0 | 1 | 0 | 0 | 0 | ···7f |
| 0 | 1 | 1 | 0 | 0 | 0 | 0 | ···7g |
| 0 | 1 | 1 | 1 | 0 | 0 | 0 | ···7h |

FIG. 11

| sel | din | dout | sel | din | dout | INSTRUCTION SEQUENCE | |
|-----|-----|------|-----|-----|------|----------------------|------|
| 0 | 0 | 0 | 0 | 0 | 0 | oe1() | ···11a |
| 0 | 0 | 1 | 0 | 0 | 0 | dout(), oe1() | ···11b |
| 0 | 1 | 0 | 0 | 1 | 1 | dout(), oe1() | ···11c |
| 0 | 1 | 1 | 0 | 1 | 1 | oe1(), | ···11d |
| 1 | 0 | 0 | 1 | 0 | 0 | oe2(), | ···11e |
| 1 | 0 | 1 | 1 | 0 | 0 | dout(), oe2() | ···11f |
| 1 | 1 | 0 | 1 | 1 | 1 | dout(), oe2() | ···11g |
| 1 | 1 | 1 | 1 | 1 | 1 | oe2() | ···11h |

FIG. 12

```
1  static int sel, din, dout;
2
3  void (*sample1_dout)(void);
4  void (*sample1_oe1)(void);
5  void (*sample1_oe2)(void);
6
7  void sample1_in()
8  {
9    if ( din != dout ) {
10     sample1_dout();
11   }
12   if ( sel == 0 ) {
13     sample1_oe1();
14   }
15   if ( sel == 1 ) {
16     sample1_oe2();
17   }
18   dout = din;
19 }
20
21 void sample1_sel()
22 {
24   sel = sel?0:1;
25 }
26
27 void sample1_din()
28 {
29   din = din?0:1;
30 }
```

FIG. 13

| function | port | type | timing | |
|---|---|---|---|---|
| in(int, int) | in | high | 0 | ···13a |
| | din | parameter | 0 | ···13b |
| | sel | parameter | 1 | ···13c |
| oe1(int) | oe1 | high | 0 | ···13d |
| | dout | parameter | 1 | ···13e |
| oe2(int) | oe2 | high | 0 | ···13f |
| | dout | parameter | 1 | ···13g |
| CLOCK | clk | | | ···13h |

FIG. 14

| in | din | sel | dout | ff_in | oe1 | oe2 | |
|---|---|---|---|---|---|---|---|
| 0 | 0 | 0 | 0 | 0 | 0 | 0 | ···14a |
| 0 | 0 | 0 | 1 | 0 | 0 | 0 | ···14b |

FIG. 18

| INPUT INSTRUCTION | START dout | END dout | OUTPUT INSTRUCTION SEQUENCE | |
|---|---|---|---|---|
| in(0,0) | 0 | 0 | oe1(0) | ...18a |
| in(0,0) | 1 | 0 | oe1(0) | ...18b |
| in(0,1) | 0 | 0 | oe2(0) | ...18c |
| in(0,1) | 1 | 0 | oe2(0) | ...18d |
| in(1,0) | 0 | 1 | oe1(1) | ...18e |
| in(1,0) | 1 | 1 | oe1(1) | ...18f |
| in(1,1) | 0 | 1 | oe2(1) | ...18g |
| in(1,1) | 1 | 1 | oe2(1) | ...18h |

FIG. 19

```
1   static int dout;
2
3   void (*sample1_oe1)(void);
4   void (*sample1_oe2)(void);
5
6   void sample1_in( int in_din, int in_sel )
7   {
8     if ( in_sel == 0 ) {
9        sample1_oe1(in_din);
10    }
11    if ( in_sel == 1 ) {
12       sample1_oe2(in_din);
13    }
14    dout = in_din:
15  }
16
```

FIG. 20

```
1  module sample2(in, ack, din, sel, oe1, oe2, ack1, ack2, dout, rst, clk):
2
3  input   in, din, sel, ack1, ack2, rst, clk:
4  output  ack, oe1, oe2, dout:
5  reg     [1:0] state;
6
7  assign  ack  = (oe1 ? ack1 : 1'b0) | ( oe2 ? ack2 :1'b0 );
8  assign  dout = din;
9  assign  oe1  = ( state ==2'b01 );
10 assign  oe2  = ( state ==2'b10 );
11
12 always @ (posedge clk) begin
13    if ( rst ) begin
14      state <= 2'b00;
15    end
16    else begin
17      case (state)
18        2'b00: if ( in ) begin
19                 state = sel ? 2'b01 :2'b10;
20               end
21        2'b01: if ( ack1 ) begin
22                 state = 2'b00;
23               end
24        2'b10: if ( ack2 ) begin
25                 state = 2'b00;
26               end
27        default: state <= 2'b00;
28      endcase
29    end
30 end
31 endmodule
```

FIG. 21

| function | port | type | timing | |
|---|---|---|---|---|
| in(int, int) | in | high | 0, $x | ···21a |
| | ack | high | x | ···21b |
| | din | parameter | 0, $x | ···21c |
| | sel | parameter | 0 | ···21d |
| oe1(int) | oe1 | high | 0, $x+1 | ···21e |
| | dout | parameter | $x+1 | ···21f |
| | ack1 | high | x+1 | ···21g |
| oe2(int) | oe2 | high | 0, $x+1 | ···21h |
| | dout | parameter | $x+1 | ···21i |
| | ack2 | high | x+1 | ···21j |
| reset() | rst | high | 0 | ···21k |
| CLOCK | clk | | | ···21l |

FIG. 26

| INPUT INSTRUCTION | OUTPUT INSTRUCTION SEQUENCE | |
|---|---|---|
| in(0, 0) | oe1(0) | ···26a |
| in(0, 1) | oe2(0) | ···26b |
| in(1, 0) | oe1(1) | ···26c |
| in(1, 1) | oe2(1) | ···26d |
| reset() | | ···26e |

FIG. 27

```
1  void (*sample2_oe1)(void);
2  void (*sample2_oe2)(void);
3
4  void sample2_in( int in_din, int in_sel )
5  {
6    if ( in_sel == 0 ) {
7      sample1_oe1(in_din);
8    }
9    if ( in_sel == 1 )  {
10     sample1_oe2(in_din);
11   }
12 }
13
14 void reset()
15 {
16 }
```

FIG. 28

```
1  module sample3(out, dout, rd, din, err, irq, clk);
2  input   out, din, err, clk;
3  output  dout, rd, irq;
4  reg     irq;
5
6  assign rd = out;
7  assign dout = din;
8  always @(poedge clk) begin
9    irq <= rd ? err:0;
10 end
11 endmodule
```

FIG. 29

| function | port | type | timing | |
|---|---|---|---|---|
| out | out | high | 0 | ···29a |
|  | dout | parameter | 1 | ···29b |
| rd | rd | high | 0 | ···29c |
|  | din | parameter | 1 | ···29d |
|  | err | parameter | 1 | ···29e |
| irq | irq | high | 0 | ···29f |
| CLOCK | clk |  |  | ···29g |

FIG. 34

| OUTPUT INSTRUCTION SEQUENCE | BRANCH CONDITION | OUTPUT INSTRUCTION SEQUENCE | RETURN VALUE | |
|---|---|---|---|---|
| rd(&in_din, &in_err) | in_din=0 and in_err=0 | | 0 | ···34a |
| | in_din=0 and in_err=1 | irq() | 0 | ···34b |
| | in_din=1 and in_err=0 | | 1 | ···34c |
| | in_din=1 and in_err=1 | irq() | 1 | ···34d |

FIG. 35

```
1  void (*sample3_rd)(int *, int *);
2  void (*sample3_irq)(void);
3
4  void sample3_out( int *out_dout )
5  {
6    int in_din, in_err;
7
8    sample3_rd( &in_din, &in_err);
9    if ( in_din == 0 )  {
10     if ( in_err == 0 )  {
11       *out_dout = 0;
12     } else {
13       sample3_irq();
14       *out_dout = 0;
15     }
16   } else {
17     if ( in_err == 0 )  {
18       *out_dout = 1;
19     } else {
20       sample3_irq();
21       *out_dout = 1;
22     }
23   }
24 }
```

FIG. 40

| INSTRUCTION | dout | dout | INSTRUCTION SEQUENCE | |
|---|---|---|---|---|
| in(in_din, 0) | dout | in_din | oe1(in_din) | ···40a |
| in(in_din, 1) | dout | in_din | oe2(in_din) | ···40b |

METHOD FOR CONVERTING A LOGIC CIRCUIT MODEL

BACKGROUND OF THE INVENTION

The present invention relates to a method for converting a logic circuit model specifically described at RT (Register Transfer) level into a high abstraction-level operation model including no concept of time.

In the conventional logic circuit design, an RT-level model based on logic synthesis is produced using a hardware description language (HDL) such as Verilog-HDL, and logic circuit blocks are designed and verified with such an RT-level model. However, simulation using the RT-level model is time-consuming because it is specifically described based on the clock and the like. It is therefore difficult to simulate a large-scale system.

For example, the following methods are conventionally disclosed for improved simulation speed: a method for eliminating a part of a logic circuit by partially fixing the inputs and registers according to the verification purposes (Japanese Laid-Open Publication No. 2001-22808); a method for integrating operations of a plurality of clocks that are not susceptible to an input/output signal into operation of one clock in a hardware model used in hardware-software cooperated simulation for connecting an instruction level simulator and a logic circuit simulator (Japanese Laid-Open Publication No. 10-187789); and a method for removing a clock signal from a logic circuit model in which the start and end of operations are defined (Japanese Laid-Open Publication No. 11-96196).

As a method for designing a system having logic circuits is disclosed a method for verifying the overall operation specification of the system based on a higher abstraction-level model and then refining the model in a stepwise manner (U.S. Pat. No. 5,870,588). High abstraction-level models used in such a design method are described in C language or the like and do not include the concept of time. Connection between such models is not implemented with a signal but with an instruction applied from block to bock of a logic circuit. In the simulation using such models, operations of the blocks are executed serially, not in parallel. Accordingly, if one block gives an instruction to another, the operation of the former block will not proceed until the operation of the latter is completed. The use of such high abstraction-level models thus enables the simulation without complicated scheduling based on the parallel operation. This improves the simulation speed and also enables the model to be produced in the early stages before a detailed specification at RL level is determined. As a result, in the early stages of design, the overall operation specification of the system can be verified and the system architecture can be reviewed by using statistical data such as the number of times each block is called. Accordingly, the system can be efficiently designed.

At the time of reusing the design resources, the models specifically described at RT-level may be present, but high abstraction-level models for use in verification of the operation specification may no longer be present. Accordingly, in order to reuse a block, a high abstraction-level model must be developed based on the specification or a specifically described model. Development and verification of such a model takes a great deal of time. Moreover, since both the specifically described model and the high abstraction-model model must be developed, mismatch of operation may possibly occur.

Of the aforementioned conventional methods for improved simulation speed, the method for partially fixing the inputs and registers would not produce a model having a sufficiently high abstraction model. Moreover, the method using only an instruction simulator for connection between blocks and the method in which the start and end of operations are defined are applicable only to the limited types of models.

SUMMARY OF THE INVENTION

It is an object of the present invention to provide a versatile method for converting a model of a logic circuit block specifically described at RT level into a high abstraction-level model for use in simulation for processing each block serially.

More specifically, according to one aspect of the present invention, a method for converting an RT-level model of a logic circuit block into a high abstraction-level operation model includes the steps of: setting one or more states of the logic circuit block as operation start states and operation end states by using input/output instruction information that represents a relation between an input/output instruction of the logic circuit block and an input/output signal corresponding to the input/output instruction; and analyzing operation of the logic circuit block. The operation analyzing step is conducted by selecting one input instruction to be analyzed from those included in the input/output instruction information, applying an input signal corresponding to the selected input instruction to the RT-level model that is in a first state selected from the operation start states, and analyzing the RT-level model and extracting an operation of the logic circuit block by varying the input signal, until the RT-level model reaches a second state of the operation end states. The operation analyzing step is repeatedly conducted for at least one or all combinations of the operation start state and the input instruction included in the input/output instruction information, and the operation model of the logic circuit block is produced based on the extracted operations.

According to the present invention, state transition of the logic circuit block according to a change in input signal caused by an input instruction, and an output instruction corresponding to a change in output signal are extracted based on the input/output instruction information that represents the relation between an input/output signal of the logic circuit block and a high abstraction-level input/output instruction. Based on the extracted result, the RT-level model can be converted into an operation model having no concept of time.

Preferably, the operation analyzing step includes the steps of producing a time series of one or more input signals corresponding to the instruction to be analyzed, producing a time series of an output signal by executing the RT-level model using the time series of the input signals until the RT-level model reaches the second state, extracting a state where the RT-level model reaches the second state as an operation of the logic circuit block, and comparing the time series of the output signal with the relation between an output instruction and an output signal corresponding thereto as defined in the input/output instruction information, and extracting the output instruction from those included in the input/output instruction information as an operation of the logic circuit block.

Preferably, the operation analyzing step includes the steps of producing at every clock one or more input signals corresponding to an input instruction included in the instruction to be analyzed, executing the RT-level model at every clock using the input signals, and producing an output signal at every clock, extracting at every clock a state where the RT-level model reaches the second state as an operation of the logic circuit block, and comparing the output signal with the relation between an output instruction and an output signal corresponding thereto as defined in the input/output instruction information, and extracting at every clock the output instruction from those included in the input/output instruction information as an operation of the logic circuit block.

Preferably, the input/output instruction information includes as an output instruction an output instruction with a response signal. The output instruction with the response signal is an instruction having both an output signal and an input signal associated therewith as a response signal thereof. In the operation analyzing step, when the output instruction with the response signal is extracted at one clock, operation of the RT-level model at a clock later than the one clock is analyzed by using the response signal produced by varying a value of the response signal corresponding to the output instruction with the response signal at a timing designated by the input/output instruction information.

Preferably, the input/output instruction information includes as an input instruction an input instruction with a response signal. The input instruction with the response signal is an instruction having both an input signal and an output signal associated therewith as a response signal thereof. In the operation analyzing step, when the input instruction with the response signal is selected at one clock as the instruction to be analyzed, operation of the RT-level model at a clock later than the one clock is analyzed by using the response signal produced based on a value of the response signal corresponding to the input instruction with the response signal, which varies at a timing designated by the input/output instruction information.

Preferably, the input/output instruction information includes as an output instruction an output instruction with a return value. The output instruction with the return value is an instruction having an input signal associated therewith as a return value. In the operation analyzing step, when operation of the RT-level model varies according to a value of the input signal serving as the return value of the output instruction, operation of the RT-level model is analyzed for every possible combination of values of the return value.

Preferably, the input/output instruction information includes as an input instruction an input instruction with a return value. The input instruction with the return value is an instruction having an output signal associated therewith as a return value. In the operation analyzing step, a value of the output signal at a clock designated by the input/output instruction information is extracted as the return value of the input instruction, and operation of the RT-level model is analyzed based on the extracted value.

Preferably, in the state setting step, a state where a state of the logic circuit block does not change in the absence of an input instruction or a state where a finite number of states of the logic circuit block are repeated in the absence of an input instruction are set as the operation start states and the operation end states.

Preferably, of state variables specifying a state of the logic circuit block, any state variable that affects an output signal used to recognize an output instruction included in the input/output instruction information is selected as a control variable, and one or more states specified by the selected control variable are set as the operation start states and the operation end states in the state setting step.

Preferably, of the one or more states designated by the control variable, states where all or at least one of the control variables have the same value are regarded as a single state when the operation start states and the operation end states are set in the state setting step.

Preferably, in the state setting step, any state variable that contributes to updating of the control variable in one-clock operation of the RT-level model is also selected as the control variable.

BRIEF DESCRIPTION OF THE DRAWINGS

FIG. 2 shows an example of an RT-level model according to the first, second and fifth embodiments of the present invention;

FIG. 3 shows an example of input/output instruction information according to the first embodiment of the present invention;

FIG. 7 shows the operation start states and operation end states according to the first embodiment of the present invention;

FIG. 11 shows the operation analysis result for the input instruction in according to the first embodiment of the present invention;

FIG. 12 shows an example of the resultant operation model according to the first embodiment of the present invention;

FIG. 13 shows an example of input/output instruction information according to the second and fifth embodiments of the present invention;

FIG. 14 shows the operation start states and operation end states according to the second embodiment of the present invention;

FIG. 18 shows the operation analysis result for the input instruction in according to the second embodiment of the present invention;

FIG. 19 shows an example of the resultant operation model according to the second and fifth embodiments of the present invention;

FIG. 20 shows an example of an RT-level model according to the third embodiment of the present invention;

FIG. 21 shows an example of input/output instruction information according to the third embodiment of the present invention;

FIG. 26 shows the operation analysis result according to the third embodiment of the present invention;

FIG. 27 shows an example of the resultant operation model according to the third embodiment of the present invention;

FIG. 28 shows an example of an RT-level model according to the fourth embodiment of the present invention;

FIG. 29 shows an example of input/output instruction information according to the fourth embodiment of the present invention;

FIG. 34 shows the operation analysis result according to the fourth embodiment of the present invention;

FIG. 35 shows an example of the resultant operation model according to the fourth embodiment of the present invention;

FIG. 40 shows the operation analysis result according to the fifth embodiment of the present invention.

DESCRIPTION OF THE PREFERRED EMBODIMENTS

Hereinafter, embodiments of the present invention will be described with reference to the accompanying drawings.

(First Embodiment)

The first embodiment of the present invention will now be described with reference to FIGS. 1 to 12.

Figure 1:
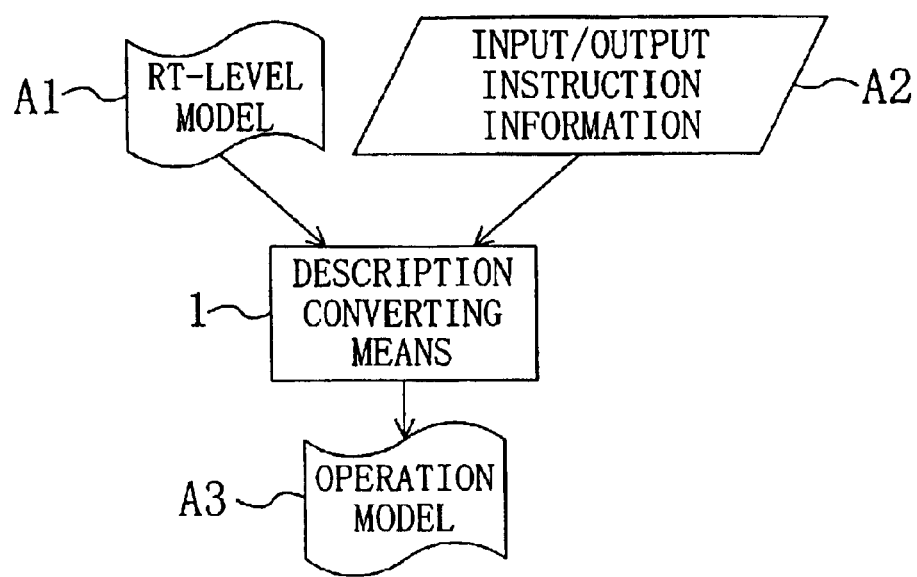
FIG. 1 schematically illustrates a method for converting a logic circuit model according to first to fifth embodiments of the present invention.

FIG. 1 schematically shows a method for converting a logic circuit model according to each embodiment of the present invention. In FIG. 1, an RT-level model A1 refers to a model in which operations of a logic circuit block are specifically described at RT level, and input/output instruction information A2 refers to information indicating the relation between input/output signal and input/output instruction of the logic circuit block. An operation model A3 is a high abstraction-level operation model produced by the method of the first embodiment. In the method of each embodiment, a description converting means 1 converts the RT-level model A1 into the operation model A3 based on the input/output instruction information A2.

FIG. 2 shows an RT-level model A1 of a logic circuit block to be converted in the present embodiment. The RT-level model A1 in FIG. 2 is described in Verilog-HDL, and includes a declaration section of input/output signals (second and third lines in FIG. 2), a decoration section of internal registers (fourth line), and an operation description section describing operation of every clock (signal clk) (sixth to twelfth lines). The operation description section has operation of updating the internal registers (seventh line and ninth to eleventh lines) and conditional determination operation (sixth line).

Hereinafter, the input/output instruction information A2 used in the first embodiment will be described with reference to FIG. 3. FIG. 3 shows an example of the input/output instruction information A2 in the present embodiment. The input/output instruction information A2 in FIG. 3 includes functions representing input/output instructions ("function"), input/output signal name ("port"), and the relation between input/output signal and input/output instruction ("type"). The "type" includes two types of declarations, "high" and "change". The declaration "high" (information 3a, 3e, 3f in FIG. 3) means that the signal value "1" represents generation of an instruction, and "0" indicates absence of an input instruction. The declaration "change" (information 3b, 3c, 3d in FIG. 3) means that a change in signal value represents generation of an instruction, and the signal value is retained at that value in the absence of an input instruction. At the bottom of FIG. 3 (information 3g in the figure), a declaration "CLOCK" is shown as a function, and "clk" indicates a clock signal.

Figure 4:
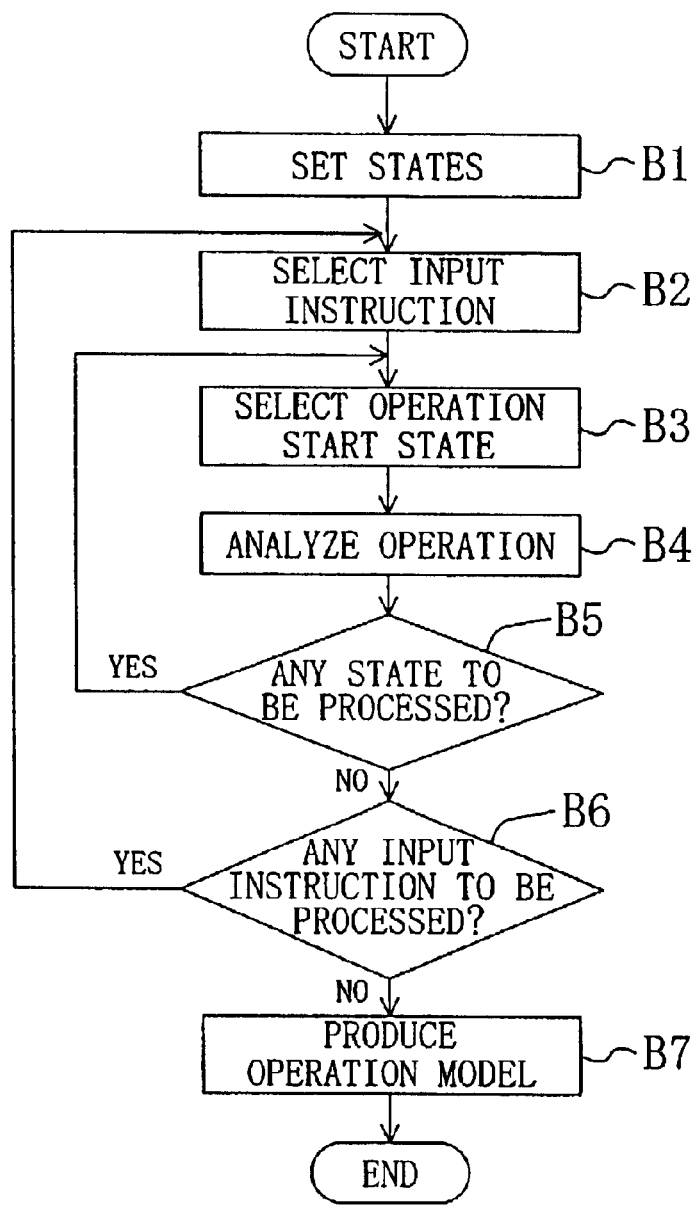
FIG. 4 is a flowchart illustrating a method for converting a logic circuit model according to the first to fifth embodiments of the present invention.

Hereinafter, a description conversion method by the description converting means 1 will be described with reference to FIG. 4. FIG. 4 is a flowchart illustrating a method for converting a logic circuit model according to each embodiment of the present invention.

Referring to FIG. 4, operation start states and operation end states of the logic circuit block are set in step B1. For example, the states of the logic circuit block can be represented by combinations of input signals and internal register values. Note that the terms "operation start state" and "operation end state" respectively refer to the states where analysis of each operation of the logic circuit block in step B4 (described below) is started and ended. In step B2, one input instruction (corresponding to an instruction to be analyzed) to the logic circuit block is selected from the input/output instruction information A2. In step B3, one of the operation start states in step B1 (which corresponds to a first state) is selected. In step B4, the input instruction selected in step B2 is applied to the RT-level model A1 in the operation start state selected in step B3, and operation of the RT-level model A1 is analyzed. Operation of the logic circuit block is thus extracted until the logic circuit block reaches one of the operation end states (which corresponds to a second state).

In step B5, it is determined whether or not extraction of operation has been completed for every combination of operation start state of step B1 and input instruction of step B2. If there is any operation start state to be processed (YES in step B5), the routine returns to step B3. Steps B3 to B5 are then repeated until extraction of operation is completed for every operation start state. On the other hand, if extraction of operation has been completed for every operation start state (NO in step B5), it is then determined in step B6 whether or not extraction of operation has been completed for every input instruction in the input/output instruction information A2. If there is any input instruction to be processed (YES in step B6), the routine returns to step B2. Steps B2 to B6 are then repeated until extraction of operation is completed for every input instruction. On the other hand, if extraction of operation has been completed for every input instruction (NO in step B6), the operation model A3 of the logic circuit block is then produced in step B7 based on the operations extracted in step B4.

Figure 5:
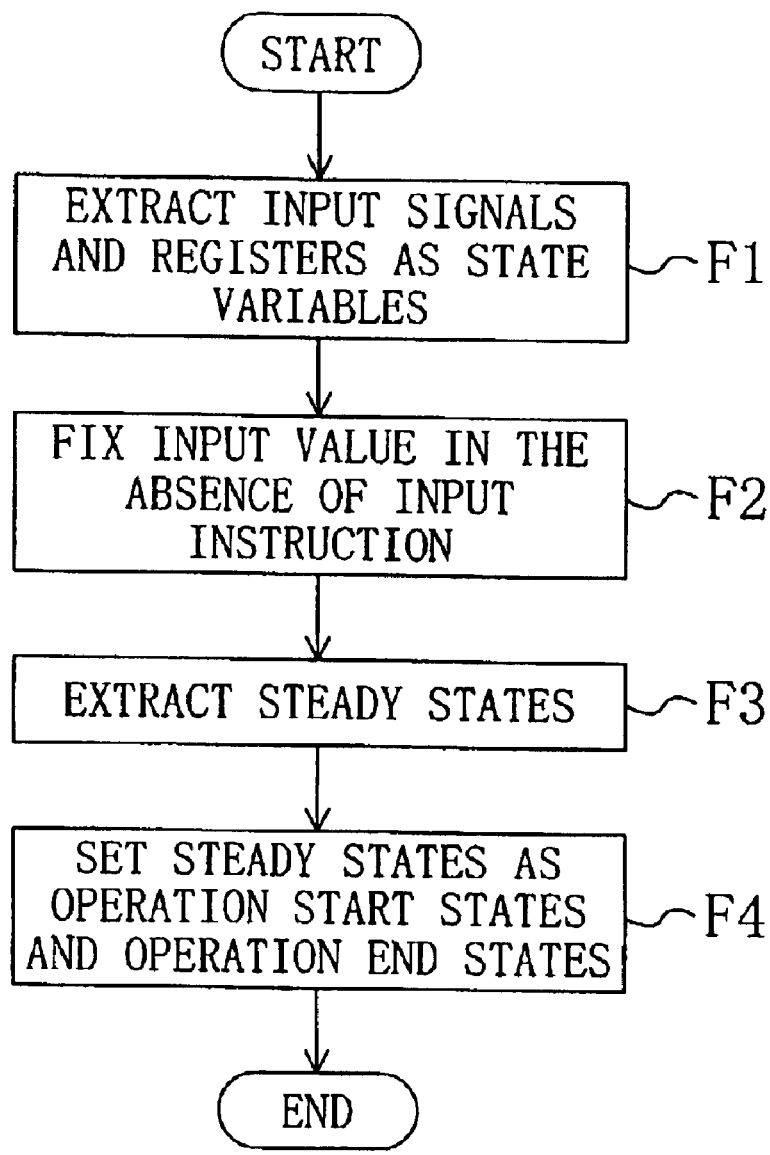
FIG. 5 is a flowchart illustrating a method for setting operation start states and operation end states according to the first to fourth embodiments of the present invention.

FIG. 5 is a flowchart illustrating step B1 in FIG. 4, that is, a method for setting operation start states and operation end states.

Referring to FIG. 5, in step F1, input signals and registers are extracted as state variables representing the states of the logic circuit block. In step F2, a fixed value is assigned to an input signal having a predetermined value in the absence of an input instruction. As a result, at least one of the state variables extracted in step F1 is fixed to a constant. In step F3, the RT-level model A1 is analyzed, and state transition is analyzed at every clock without changing the input signals other than the clock signal. Steady states are thus extracted. The term "steady state" herein refers to the state that does not change after one clock, or the state that is restored after a plurality of clocks. Note that, since the input signals are included in the state variables, there is no branch in state transition. Moreover, the input signals will not be changed by the state transition. Therefore, in order to determine whether a certain state is a steady state or not, the state transition need only be examined at most over the same number of clocks as that of combinations of register values. Note that, in the present invention, the method for extracting the steady states is not limited to that described above.

Finally, in step F4, the steady states extracted in step F3 are set as operation start states and operation end states. Note that, in the present invention, the method for setting operation start states and operation end states is not limited to that described above. For example, the user may manually set operation start states and operation end states. Although the same states are herein used as operation start states and operation end states, different states may alternatively be used.

Figure 6:
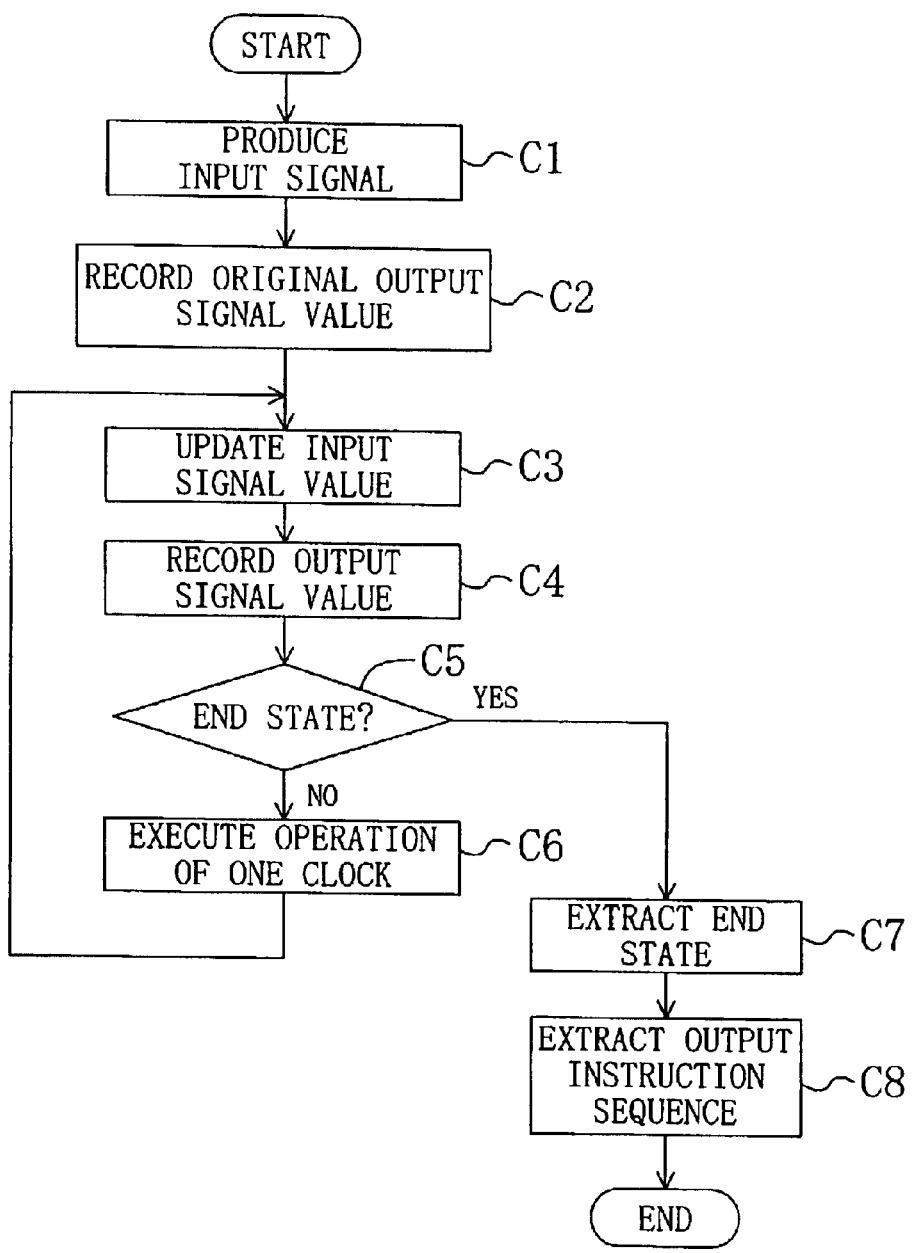
FIG. 6 is a flowchart illustrating a method for analyzing operation of a logic circuit model according to the first, second and fifth embodiments of the present invention.

FIG. 6 is a flowchart illustrating the operation analysis process (step B4 in FIG. 4).

Referring to FIG. 6, in step C1, an input signal is produced using both a change in input signal caused by the input instruction selected in step B2 (i.e., the input instruction to be analyzed) and an input signal value in the operation start state. In step C2, an output signal value in the absence of the input instruction, that is, an original output signal value, is recorded in the operation start state selected as a first state in step B3. In step C3, the input signal value is updated according to the input signal produced in step C1. In step C4, an output signal value for the updated input signal value in step C3 is recorded.

In step C5, the state of the logic circuit block is examined in order to determine whether the logic circuit block has reached the end state or not. If the logic circuit block has not reached the operation end state as a second state or if the change in input signal value corresponding to the input instruction has not been completed, it is determined that the logic circuit block has not reached the end state (NO in step C5), and the routine proceeds to step C6. On the other hand, if the logic circuit block has reached the operation end state and the change in input signal value has been completed, it is determined that the logic circuit block has reached the end state (YES in step C5), and the routine proceeds to step C7. In step C6, operation of one clock is executed in order to update the state of the logic circuit block, and the routine then returns to step C3. Steps C3 to C6 are repeated until the logic circuit block reaches the end state in step C5. In step C7, the operation end state that the logic circuit block has reached is extracted.

Finally, in step C8, the output signal sequence recorded in steps C2, C4 is compared with an output signal pattern of the output instructions defined by the input/output instruction information A1. Based on the comparison result, a corresponding output instruction or instructions are extracted to produce an output instruction sequence. If a plurality of output instructions are extracted in step C8, the output instruction that was recognized first is arranged at the head of the output instruction sequence. If the plurality of output instructions are recognized simultaneously, the output instructions may be arranged into the output instruction sequence in any order. Note that, in the present invention, the order of the output instructions in the output instruction sequence is not limited to that described above.

If the clock is advanced in the absence of the input instruction, every state would reach any one of the steady states. In the present embodiment, the steady states are used as operation end states. In this case, if the clock is advanced for every combination of operation start state and input instruction, the logic circuit block would reach any one of the operation end states. Accordingly, the operation analysis in FIG. 6 can be completed properly.

On the other hand, if the operation end states are set manually, the logic circuit block does not reach the operation end state in step C5, and the operation analysis in FIG. 6 may not be completed. In this case, whether the logic circuit block reaches the operation end state or not is determined for every combination of operation start state and input instruction before or during execution of step B4. It should be appreciated that, if it is determined that the logic circuit block does not reach the operation end state, operation can be terminated with notification that setting of the operation start states and operation end states is unsatisfactory.

When operation is analyzed for every combination of input instruction and operation start state, the operation start state is changed before the input instruction. However, the present invention is not limited to this.

Note that, a means for setting the operation start state for each input instruction is required for simulation with the resultant operation model A3. Such a means can be easily added to the operation model A3 by separately setting the initial operation start state (i.e., the operation start state upon startup) and the operation start state for the input instruction applied after each operation end state is reached. In the present embodiment, the same states are used as the operation start states and operation end states. This eliminates the need to specify the relation between the operation start state and the operation end state. In the present embodiment, the initial operation start state is set from the outside at the start of the simulation, and therefore is not specified in the resultant operation model A3. Alternatively, the initial operation start state may be set based on the operation end state reached with every input signal value and every register value being set to "0". In this case, the operation start state corresponding to that operation end state is used as the initial operation start state.

In the present embodiment, operation is analyzed for every combination of the operation start states. However, it should be understood that unlikely operation start states may be omitted from the analysis. In other words, operation may be analyzed only for the likely operation start states. For example, operation for the initial operation start state is analyzed first. An operation end state corresponding to the initial operation start state is then obtained, and an operation start state corresponding to that operation end state is used as a likely operation start state. Thereafter, operation is sequentially analyzed for each likely operation start state. In this way, only the operations for the likely operation start states can be obtained.

Based on the above method for converting a logic circuit model, a process of producing the operation model A3 by the description converting means 1 will now be described specifically. The description converting means 1 herein produces the operation model A3 based on the RT-level model A1 in FIG. 2 and the input/output instruction information A2 in FIG. 3 according to the conversion method in FIG. 4.

In step B1, the description converting means 1 sets operation start states and operation end states according to the method of FIG. 5. More specifically, in step F1, input signals in, sel, din and registers ff_in, oe1, oe2, dout of the RT-level model A1 in FIG. 2 are selected as state variables. The input signal value is then fixed in step F2. Since the information 3a in FIG. 3 includes declaration "high" for input signal in, the input signal value is "0" in the absence of input instruction. Accordingly, the input signal value is fixed to "0". In step F3, the RT-level model A1 in FIG. 2 is analyzed, and eight states 7a to 7h in FIG. 7 are extracted as steady states. In step F4, the extracted eight steady states are set as operation start states and operation end states.

The description converting means 1 then proceeds to step B2 and selects one instruction from the input/output instruction information A2 in FIG. 3 as an instruction to be analyzed. It is herein assumed that the description converting means 1 selects an input instruction in of information 3a. In step B3, the description converting means 1 selects one of the operation start states in step B1 as a first state, and then proceeds to step B4. It is herein assumed that the description converting means 1 selects the state 7c in FIG. 7. In step B4, the description converting means 1 analyzes operation of the RT-level model A1 (FIG. 2) for the input instruction in according to the operation analysis method in FIG. 6.

Figure 8:
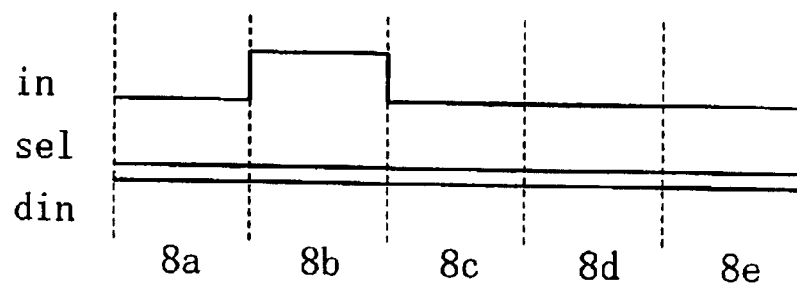
FIG. 8 shows input signals corresponding to an input instruction in according to the first embodiment of the present invention.
Figure 9:
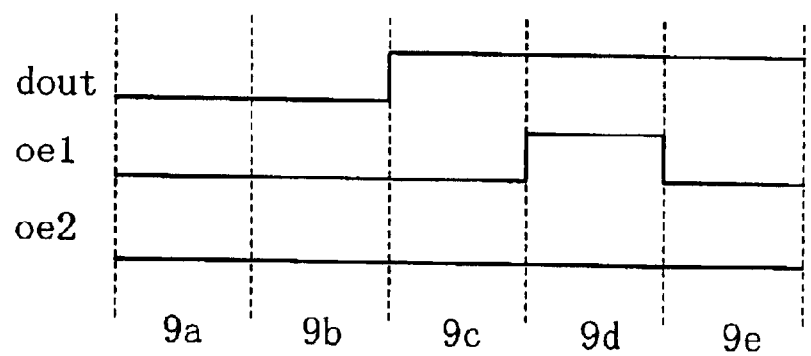
FIG. 9 shows output signals corresponding to the input instruction in according to the first embodiment of the present invention.
Figure 10:
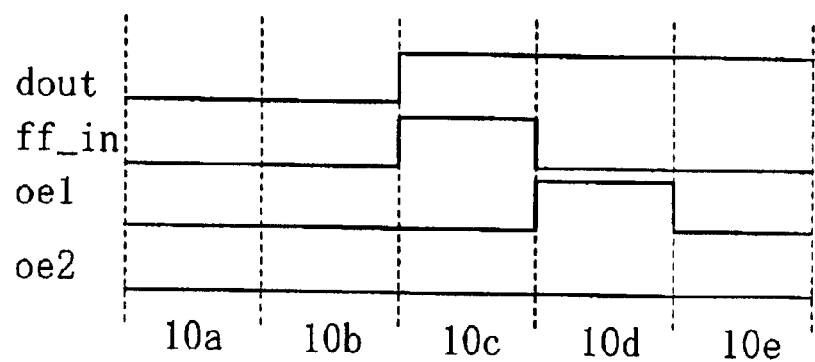
FIG. 10 shows register values corresponding to the input instruction in according to the first embodiment of the present invention.

Hereinafter, the operation analysis process in step B4 will be specifically described with reference to FIG. 6 and FIGS. 2, 7, 8, 9 and 10. FIG. 8 shows input signals, FIG. 9 shows output signals, and FIG. 10 show internal register values.

First, an input signal is produced by using both a change in input signal caused by application of the input instruction in selected in step B2 to the logic circuit block and an input signal value in the operation start state 7c in FIG. 7 (step C1). In the information 3a in FIG. 3, "high" is declared for the input signal in. Therefore, the input signal in is set to "1" right after the input instruction in is applied to the logic circuit block, and set to "0" in the following clocks. In FIG. 8, input signal value 8a indicates an input signal value before application of the input instruction in, input signal value 8b indicates an input signal value at the first clock, i.e., an input signal value upon application of the input instruction in, and input signal value 8c is an input signal value at the second clock. Since the signal for the input instruction in is applied at the first clock, the input signal has the same value in the following clocks. Thereafter, an output signal value 9a corresponding to the input signal value 8a (i.e., an output signal value before the start of operation) is recorded (step C2). The input signal value is then updated to the input signal value 8b (step C3), and an output signal value 9b at the first clock is recorded (step C4). The current input signal value and the current state are then examined in step C5. The change in input signal in is not completed at the first clock. Therefore, it is determined that the logic circuit block has not reached the end state, and the routine then proceeds to step C6 (NO in step C5). In step C6, operation of one clock is executed and each internal register value is updated to an internal register value 10c in order to change the state. It should be noted that the internal register values 10a, 10b in FIG. 10 are register values in the operation start state.

The routine then returns to step C3, and steps C3 to C5 are repeated at the second clock. In step C5, the current input signal value and the current state are examined. At the second clock, the register value ff_in is "1" and thus does not match the operation end state as a second state. Accordingly, it is determined that the logic circuit block has not reached the end state, and the routine proceeds to step C6 (NO in step C5). In step C6, operation of one clock is executed, and steps C3 to C5 are then repeated at the third clock. In step C5, the current input signal value and the current state are examined. At the third clock, the register value oe1 is "1" and thus does not match the operation end state. Accordingly, it is determined that the logic circuit block has not reached the end state, and the routine proceeds to step C6 (NO in step C5). In step C6, operation of one clock is executed, and steps C3 to C5 are then repeated at the fourth clock.

In step C5, the current input signal value and the current state are examined. This time, the change in input signal value corresponding to the input instruction in has been completed, and the input signals and the register values match the operation end state 7d in FIG. 7. Therefore, it is determined that the logic circuit block has reached the end state, and the routine proceeds to step C7 (YES in step C5). In step C7, the operation end state 7d of the logic circuit block is extracted. Finally, in step C8, the output signal sequence in FIG. 9 recorded in steps C2, C4 is compared with an output signal pattern of the output instructions defined by the input/output instruction information A2 in FIG. 2. In this example, the output signal dout changes at the second clock (output signal value 9c in FIG. 9), and this change corresponds to an output instruction dout. Moreover, the output signal oe1 changes to "1" at the third clock (output signal value 9d in FIG. 9), and this change corresponds to an output instruction oe1. The operations dout, oe1 are thus extracted in step C8. Note that the extraction result in this example corresponds to an extraction result 11c in FIG. 11 described below.

After the operation analysis process of step B4 is completed, the routine proceeds to step B5. In this way, steps B2 to B6 are repeatedly conducted according to the flowchart of FIG. 4 in order to extract the operation for every combination of operation start state in FIG. 7 and input instruction. FIG. 11 shows the extraction result obtained when the input instruction in is applied to each state 7a to 7h in FIG. 7. More specifically, FIG. 11 shows the values of input signal sel, input signal din and output signal dout before application of the input instruction in, the values of input signal sel, input signal din and output signal dout after execution of the input instruction in, and the extracted output instruction sequence. Note that input signal in and register values ff_in, oe1, oe2 are omitted because each has the same value in all operation start states and operation end states.

After operation is extracted for every combination of operation start state in FIG. 7 and input instruction, the routine proceeds to step B7, and the operation model A3 of the logic circuit is produced based on the extracted operations. The operation model A3 may be described in C language. In this case, the operation model A3 is produced by defining variables for storing a value representing the state of the logic circuit block and functions corresponding to the output instructions, and for every input instruction, describing operation of each function for every operation start state, and also defining functions that describe operation of calling a function sequence corresponding to an output instruction sequence and operation of changing the operation end state.

Some of the values representing the states of the logic circuit block may have the same value in every operation start state and every operation end state. Such values are not necessary to distinguish between operation start states and between operation end states, and therefore can be omitted from production of the operation model A3. Incorporating a variable value representing an operation start state into a conditional expression or the right side of an assignment statement to a variable would enable the same output instruction and a change in variable which are included in the analysis process for a plurality of operation start states to be collectively described.

FIG. 12 shows an example of the resultant operation model A3. Referring to FIG. 12, the operation model A3 produced in the present embodiment is described in C language. The operation model A3 in FIG. 12 includes declarations of variables for storing state variables used to identify the state of the logic circuit block (first line in FIG. 12), declarations of functions for output instructions (third to fifth lines), and functions corresponding to input instructions (seventh to thirtieth lines). A block module name is added to the function name of each input instruction in order to distinguish the functions from those of another block. Operation for the input instruction in is described in the seventh to nineteenth lines. It is herein assumed that the state 7a of FIG. 7 (the state where every variable value is zero) corresponds to an initial operation start state, and each operation end state corresponds to the following operation start state. Pointers to functions are herein used as the declarations of functions for output instructions so that a plurality of blocks may be connected together by substituting addresses of input instruction functions of another block for the pointers.

Note that, in the present invention, a method for producing the operation model A3 based on the extracted operations is not limited to that described above. Moreover, the above description style of the operation model is by way of illustration only, and the present invention is not limited to this.

As has been described above, according to the method for converting a logic circuit model in the present embodiment, the input/output instruction information A2 indicating the relation between input/output signal and input/output instruction of the logic circuit block is applied to the logic circuit model specifically described at RT level. As a result, operation of the logic circuit block is extracted for every input instruction, facilitating production of a high abstraction-level operation model A3 for use in serial simulation including no concept of clock.

Note that, in the present embodiment, the RT-level model A1 in FIG. 2 is described in Verilog-HDL, and the operation model A3 in FIG. 12 is described in C language.

However, the present embodiment is not limited to these description languages. The present embodiment can be similarly implemented with another description language such as VHDL and C++.

In the present embodiment, every input signal to the RT-level model A1 corresponds to any one of instructions. However, a fixed value may be assigned to an input signal used in the functions that are not required for the operation model A3 (such as an input signal to the test circuitry), and unnecessary logic may be eliminated according to the method disclosed in Japanese Laid-Open Publication No. 2001-22808. It should be understood such an RT-level model can also be efficiently converted into the operation model A3 by using the method of the present embodiment.

(Second Embodiment)

Hereinafter, the second embodiment of the present invention will be described with reference to FIGS. 2 to 6 and FIGS. 13 to 19.

In the first embodiment, a one-clock value of each input/output signal corresponds to a single input/output instruction. However, there may be the cases where combination of a plurality of signals corresponds to a single instruction, where a part of a signal serves as a parameter corresponding to a single instruction, and where a change in signal in a plurality of clocks corresponds to a single instruction.

A method for converting an RT-level model A1 of a logic circuit block into an operation model A3 according to the present embodiment is applied to the case where a change in a plurality of input/output signals over a plurality of clocks corresponds to a single input/output instruction.

FIG. 13 shows an example of the input/output instruction information A2 according to the present embodiment. In the input/output instruction information A2 of FIG. 13, the timing when the signal changes ("timing") is described in addition to the information of FIG. 3 in the first embodiment. Like information 13b, 13c in FIG. 13, the blank in "function" means that the information is about the instruction corresponding to the function designated in the line right above the blank. For example, the instruction corresponding to a function in in information 13a is associated with three input/output signals in, din, sel ("port"). The declaration "parameter" as in information 13b, 13c means as follows: if the signal having a declaration "parameter" is an input signal, this declaration means that an argument value of a corresponding input instruction is used as an input signal at the designated timing; and if the signal having a declaration "parameter" is an output signal, a signal value that is output at the designated timing is used as an argument of a corresponding output instruction. Moreover, if an input signal is a parameter, the signal value has a predetermined value only at the designated timing. In other words, the input signal may have any value at the timing other than the designated timing. Therefore, it is assumed that the input signal is zero at the timing other than the designated timing. If an output signal is a parameter, the value of the output signal will not be used to determine whether an output instruction is generated or not in the step of extracting an output instruction. The timing is designated as follows: the timing (clock) when an input instruction or output instruction is started is regarded as the zeroth clock. Therefore, the timing of changing a signal and the timing of fetching a parameter signal are designated by the clock.

Hereinafter, a method for producing the operation model A3 according to the present embodiment will be described. Like the first embodiment, the operation model A3 is produced according to the flowcharts of FIGS. 4 and 6. In step B2, however, each value of the parameter is regarded as a different instruction. If an output signal having an argument is extracted in step B4, the output signal value at the timing designated in the input/output instruction information A2 of FIG. 13 is used as an argument value. If a plurality of output instructions are extracted, the output instruction recognized first is arranged at the head of the output instruction sequence. If the plurality of output instructions are recognized simultaneously, the output instructions may be arranged into the output instruction sequence in any order. Note that, in the present invention, the order of the output instructions is not limited to that described above.

Hereinafter, the process of producing the operation model A3 by the description converting means 1 will be described specifically. The description converting means 1 herein produces the operation model A3 based on the RT-level model A1 in FIG. 2 and the input/output instruction information A2 in FIG. 13.

In step B1, the description converting means 1 sets operation start states and operation end states according to the method of FIG. 5. Steady states of the logic circuit block can be represented using the values of input signals in, sel, din and registers ff_in, oe1, oe2, dout of the RT-level model A1 in FIG. 2. The steady states as operation start states and operation end states are obtained in the same manner as that of the first embodiment. In the present embodiment, however, "parameter" is declared for input signals sel, din, as shown in FIG. 13. Therefore, the input signals sel, din are fixed to zero in the absence of an input instruction. Two states 14a, 14b in FIG. 14 are thus set in step B1.

In step B2, the description converting means 1 selects one instruction from the input/output instruction information A2 in FIG. 13 as an instruction to be analyzed. It is herein assumed that the description converting means 1 selects an instruction in of information 13a, and selects "1" as respective arguments corresponding to the input signals din, sel serving as parameter signals. In step B3, the description converting means 1 selects one of the operation start states in step B1 as a first state. It is herein assumed that the description converting means 1 selects the state 14a in FIG. 14. In step B4, the description converting means 1 analyzes operation of the RT-level model A1 (FIG. 2) for the input instruction in according to the operation analysis method in FIG. 6.

Figure 15:
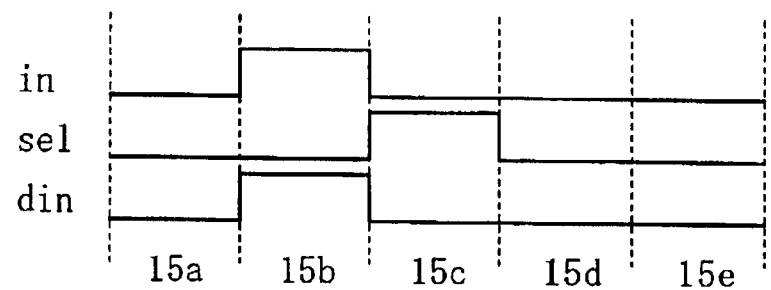
FIG. 15 shows input signals corresponding to an input instruction in according to the second embodiment of the present invention.
Figure 16:
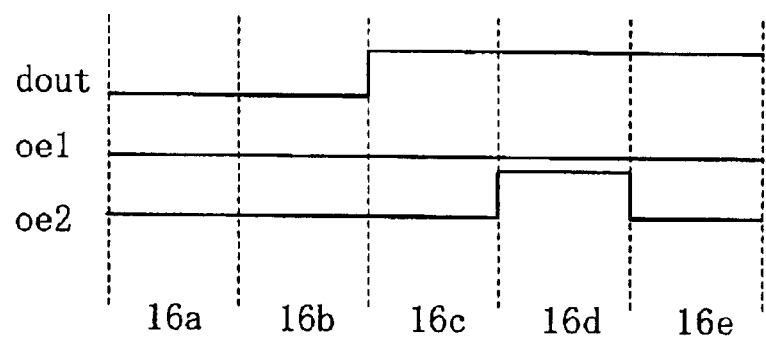
FIG. 16 shows output signals corresponding to the input instruction in according to the second embodiment of the present invention.
Figure 17:
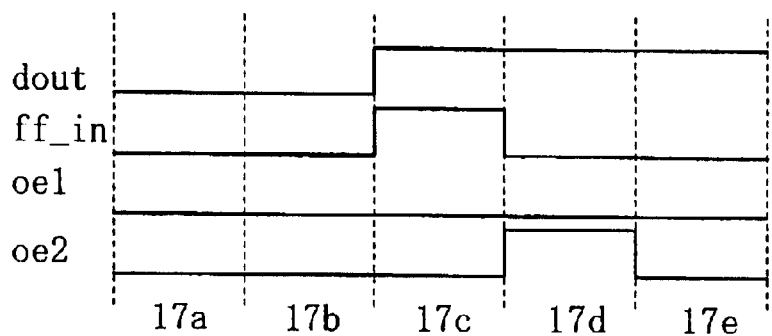
FIG. 17 shows register values corresponding to the input instruction in according to the second embodiment of the present invention.

Hereinafter, the operation analysis process in step B4 will be specifically described with reference to FIG. 6 and FIGS. 13 to 17. FIG. 15 shows input signals, FIG. 16 shows output signals, and FIG. 17 show internal register values.

First, an input signal is produced by using both a change in input signal caused by application of the input instruction in selected in step B2 to the logic circuit block and an input signal value in the operation start state 14a in FIG. 14 (step C1). In the information 13a in FIG. 13, "high" is declared for the input signal in. Therefore, the input signal in is set to "1" right after the input instruction in is applied to the logic circuit block, and set to "0" in the following clocks. For the input signal din, "parameter" is declared and the timing is "0". Therefore, the input signal din is set to "1" (i.e., the value selected as an argument) right after the input instruction in is applied to the logic circuit block, and set to "0" in the following clocks. For the input signal sel, "parameter" is declared and the timing is "1". Therefore, the input signal sel is set to "1" (i.e., the value selected as an argument) at the second clock and set to "0" in the following clocks. In FIG. 15, input signal value 15a indicates an input signal value before the input instruction in is applied, input signal value 15b indicates an input signal value at the first clock, i.e., an input signal value upon application of the input instruction in, and input signal value 15c is an input signal value at the second clock. Since the signal corresponding to the input instruction in is applied at the second clock, the input signal has the same value in the following clocks.

Thereafter, an output signal value 16a corresponding to the input signal value 15a, (i.e., an output signal value before the start of operation) is recorded (step C2). The input signal value is then updated to the input signal value 15b (step C3), and an output signal value 16b at the first clock is recorded (step C4). The current input signal value and the current state are then examined in step C5. The change in input signals corresponding to the input instruction is not completed at the first clock. Therefore, it is determined that the logic circuit block has not reached the end state, and the routine then proceeds to step C6 (NO in step C5). In step C6, operation of one clock is executed and each internal register value is updated to an internal register value 17c in order to change the state. It should be noted that the internal register values 17a, 17b in FIG. 17 are register values in the operation start state.

The routine then returns to step C3, and steps C3 to C5 are repeated at the second clock. In step C5, the current input signal value and the current state are examined. At the second clock, the change in input signals corresponding to the input instruction in has not been completed. Accordingly, it is determined that the logic circuit block has not reached the end state, and the routine proceeds to step C6 (NO in step C5). In step C6, operation of one clock is executed, and steps C3 to C5 are then repeated at the third clock. In step C5, the current input signal value and the current state are examined. At the third clock, the internal register value oe2 is "1" and thus does not match the operation end state as a second state. Accordingly, it is determined that the logic circuit block has not reached the end state, and the routine proceeds to step C6 (NO in step C5). In step C6, operation of one clock is executed, and steps C3 to C5 are then repeated at the fourth clock.

In step C5, the current input signal value and the current state are examined. This time, the change in input signals corresponding to the input instruction in has been completed, and the input signals and the register values match the operation end state 14b in FIG. 14. Therefore, it is determined that the logic circuit block has reached the end state, and the routine proceeds to step C7 (YES in step C5). In step C7, the operation end state 14b of the logic circuit block is extracted. Finally, in step C8, the output signal sequence in FIG. 16 recorded in steps C2, C4 is compared with an output signal pattern of the output instructions defined by the input/output instruction information A2 in FIG. 13. In this example, the output signal oe2 changes to "1" at the third clock (output signal value 16d in FIG. 16), and this change corresponds to an output instruction oe2. The operation oe2 is thus extracted in step C8. The output signal dout is used as an argument of the output instruction oe2, and the timing of the output signal dout is "1".

Therefore, the output signal dout at the clock right after the clock the output signal oe2 becomes "1" is used as an argument of the output instruction oe2. More specifically, value "1" in output signal value 16e is used as an argument of the output instruction oe2. Note that this extraction result corresponds to an extraction result 18g in FIG. 18 described below.

After the operation analysis process of step B4 is completed, the routine proceeds to step B5. In this way, steps B2 to B6 are repeatedly conducted according to the flowchart of FIG. 4 in order to extract the operation for every combination of operation start state in FIG. 14 and input instruction. FIG. 18 shows the extraction result obtained when the input instruction in is applied in each state 14a, 14b in FIG. 14. More specifically, FIG. 18 shows an input instruction including an argument, the value of output signal dout before application of the input instruction in, the value of output signal dout after execution of the input instruction in, and the extracted output instruction sequence. Note that input signals in, sel, din and register values ff_in, oe1, oe2 are omitted because each has the same value in every operation start state and every operation end state.

After operation is extracted for every combination of operation start state in FIG. 14 and input instruction, the routine proceeds to step B7, and the operation model A3 of the logic circuit is produced based on the extracted operations, as shown in FIG. 19. FIG. 19 shows an example of the operation model A3 produced in the present embodiment. The operation model A3 is herein described in C language. The operation model A3 in FIG. 19 includes declarations of variables for storing state variables used to identify the state of the logic circuit block (first line in FIG. 19), declarations of functions for output instructions (third and fourth lines), and functions corresponding to input instructions (sixth to fifteenth lines). A block module name is added to the function name of each input instruction in order to distinguish the functions from those of another block. Regarding the operation for each combination of operation start state and argument of input instruction, the same output instruction and a change in state variable are described collectively.

As has been described above, according to the method for converting a logic circuit model in the present embodiment, the input/output instruction information A2 indicating the relation between input/output signal and input/output instruction of the logic circuit block is applied to the logic circuit model specifically described at RT level. Even if the input/output instruction information includes the relation between a change of a plurality of clocks in a plurality of clocks and a single instruction, operation of the RT-level model A1 is extracted for every input instruction, facilitating production of a high abstraction-level operation model A3 for use in serial simulation including no concept of clock.

(Third Embodiment)

Hereinafter, the third embodiment of the present invention will be described with reference to FIG. 4 and FIGS. 20 to 27.

In the first and second embodiments, each input instruction corresponds only to an input signal, and each output instruction corresponds only to an output signal. However, the first the second embodiments are inapplicable if there is an instruction requiring a response signal as in a handshake protocol. The reason for this is as follows: if there is an output instruction requiring a response signal, it is impossible to analyze the operation beyond the state of waiting for the response signal to change. Therefore, the logic circuit block cannot reach the operation end state. As a result, required operations cannot be extracted, and thus the operation model A3 cannot be produced. Moreover, if there is an input instruction requiring a response signal and an input signal changes according to a change in response signal, the input signal cannot be produced. Therefore, operation cannot be analyzed and thus the operation model A3 cannot be produced.

In the third embodiment of the present invention, a method for converting an RT-level model A1 of a logic circuit block having an input/output instruction requiring a response signal into an operation model A3 will be described.

In the third embodiment, an RT-level model A1 of the logic circuit block in FIG. 20 is converted into an operation model A3. FIG. 20 shows an example of the RT-level model A1 described in Verilog-HDL.

First, input/output instruction information A2 used in the present embodiment will be described with reference to FIG. 21. FIG. 21 shows an example of the input/output instruction information A2 of the present embodiment. The input/output instruction information A2 of FIG. 21 includes declarations of functions representing input/output instructions ("function"), input/output signal name ("port"), relation between input/output signal and input/output instruction ("type"), and timing ("timing"). The input instruction in is an input instruction having a response signal. In information 21b in FIG. 21 (i.e., information about an output signal ack for the input instruction in), "x" means that the timing the output signal ack becomes "1" is indefinite. In information 21a in FIG. 21 (i.e., information about an input signal in for the input instruction in), "0", "$x" means that the input signal in is "1" until timing "x" (i.e., from the start of the input instruction until the output signal ack becomes "1"), and the input signal in is "0" after timing "x". The output instruction oe1 is an output instruction having a response signal. In information 21g (i.e., information about an input signal ack1 for the output instruction oe1), "x+1" means that the input signal ack1 becomes "1" at the second or later clock after the signal for the output instruction is changed. In information 21f (i.e., information about an output signal dout), "$x+1" means that the clock value "x+1" (the timing the input signal ack1 becomes "1") is used as an argument. Note that input instructions and output instructions can be distinguished according to the direction of the initially designated signal.

Figure 22:
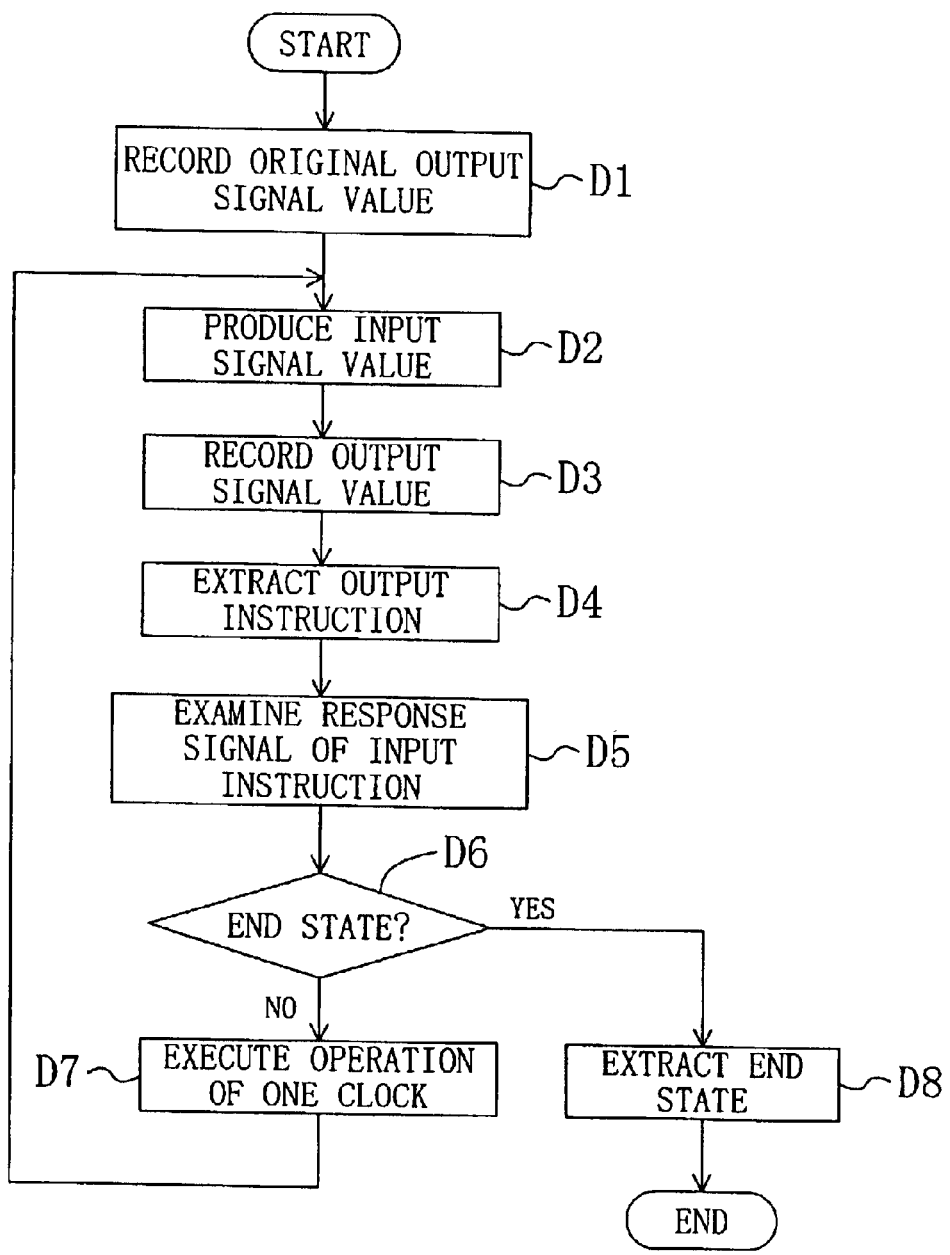
FIG. 22 is a flowchart illustrating a method for analyzing operation of a logic circuit model according to the third embodiment of the present invention.

Hereinafter, a description conversion method by the description converting means 1 will be described. The description conversion method of the third embodiment is the same as the method of FIG. 4 described in the above embodiments except the operation analysis process B4. Therefore, only the operation analysis process B4 is herein described with reference to FIG. 22. FIG. 22 is a flowchart illustrating the operation analysis process B4 of the present embodiment.

Referring to FIG. 22, in step D1, an output signal value in the absence of an input instruction, that is, an original output signal value, is recorded in the operation start state selected as a first state in step B3. In step D2, an input signal corresponding to one clock is produced as an input signal to the logic circuit block. Note that, based on the input/output instruction information A2, a change in input signal value of the selected input instruction is reflected on the input signal, if necessary. If an input signal of the input instruction changes depending on the timing an output signal changes, the timing the input signal changes is determined based on the timing the output signal recognized in step D5 (described below) changes. In step D4 described below (the step of extracting an output instruction having a response signal), a change in input signal value of the extracted output instruction is reflected on the input signal according to the input/output instruction information A2. If the input signal of the extracted output instruction changes at an indefinite timing, it is assumed that the input signal changes at the earliest timing within the designated range.

In step D3, an output signal value corresponding to the updated input signal value of step D2 is added to an output signal sequence. In step D4, the output signal recorded in step D3 is compared with an output signal of an output instruction designated in the input/output instruction information A2, and a new output instruction is extracted, if any. Whether a new output instruction is generated or not is determined by determining whether the output signal has changed to a prescribed value or not. If an output instruction having an argument is extracted in step D4, the output signal value at a prescribed clock is extracted as the argument of the output instruction. In step D5, an output signal of the input instruction having a response signal is examined in order to determine whether or not the response signal has changed as designated in the input/output instruction information A2.

In step D6, whether the logic circuit block has reached the end state or not is determined. If the logic circuit block has reached the end state (YES in step D6), the routine proceeds to step D8. Otherwise (NO in step D6), the routine proceeds to step D7. The term "end state" herein refers to the state satisfying the following requirements: the logic circuit block has reached any one of the operation end states as a second state; a change in input/output signal of the input instruction has been completed; and a change in input/output signal of the output instruction extracted in step D4 has been completed. In step D7, operation of one clock is executed to update the state of the logic circuit block. The routine then returns to step D2, and steps D2 to D7 are repeated until the logic circuit state reaches the end state in step D6 (YES in step D6). In step D8, the operation end state that the logic circuit block has reached in step D6 is extracted, and the operation analysis process B4 in FIG. 22 is completed.

If no response signal to the input instruction is generated, a change in input signal of the input instruction will not be completed. Therefore, the operation analysis process in FIG. 22 may not be completed. In this case, whether the input signal of the input instruction changes or not is determined before or during execution of the operation analysis process in FIG. 22. If the input signal does not change, operation analysis is not conducted or discontinued with a failure report. It should be understood that, if combination of that input instruction and operation start state occurs, the process can be terminated by producing the operation model A3 reporting the error.

Hereinafter, the process of producing the operation model A3 by the description converting means 1 will be specifically described. The description converting means 1 herein produces the operation model A3 based on the RT-level model A1 in FIG. 20 and the input/output instruction information A2 in FIG. 21.

In step B1, the description converting means 1 sets operation start states and operation end states according to the method of FIG. 5. More specifically, the description converting means 1 obtains steady states of the logic circuit block in the same manner as that of the above embodiments. In the illustrated example, the following three states are extracted as steady states: every input signal value in the RT-level model A1 of FIG. 20 is "0" and the register state is "0", "1", "2". These three states may be set as both operation start states and operation end states. However, it is herein assumed that only one of the three states (the state where every input signal value is "0" and the register state is "0") is set as an operation start state.

In step B2, the description converting means 1 then selects one instruction from the input/output instruction information A2 in FIG. 21 as an instruction to be analyzed. It is herein assumed that the description converting means 1 selects an input instruction in of information 21a, and sets the respective arguments of input signals sel, din to "1". In step B3, the description converting means 1 selects one of the operation start states in step B1 as a first state. Since only one operation start state is set as an operation start state in step B1, the description converting means 1 selects that operation start state as a first state. In step B4, the description converting means 1 analyzes operation of the RT-level model A1 (FIG. 20) for the input instruction in according to the operation analysis method in FIG. 22.

Figure 23:
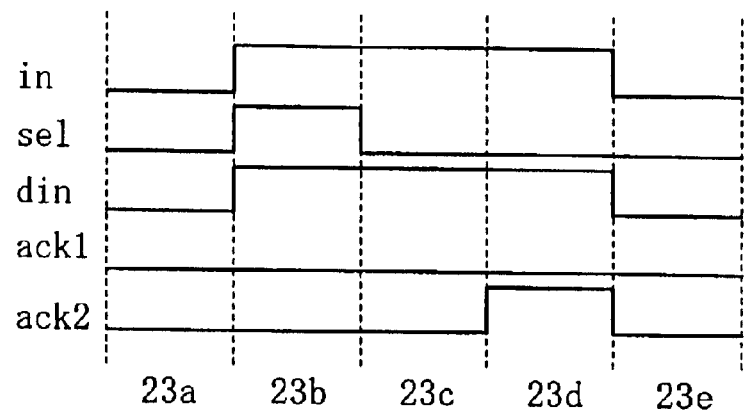
FIG. 23 shows input signals corresponding to an input instruction in according to the third embodiment of the present invention.
Figure 24:
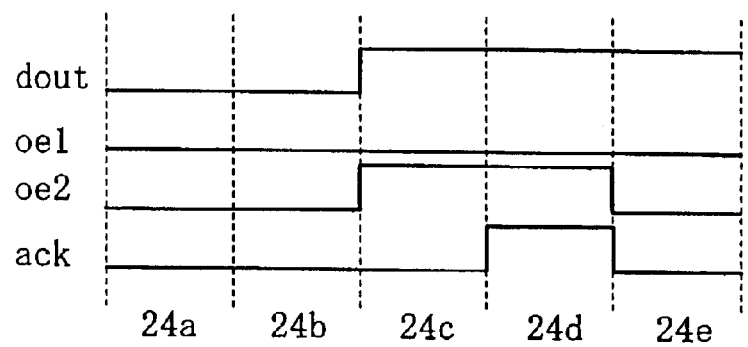
FIG. 24 shows output signals corresponding to the input instruction in according to the third embodiment of the present invention.
Figure 25:
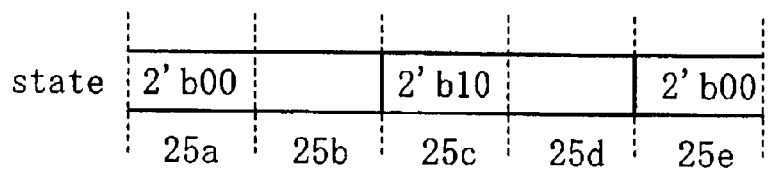
FIG. 25 shows a register value corresponding to the input instruction in according to the third embodiment of the present invention.

Hereinafter, the operation analysis process in step B4 will be specifically described with reference to FIG. 22 and FIGS. 23 to 26. FIG. 23 shows input signals produced during the process, FIG. 24 shows output signals, and FIG. 25 show an internal register value.

First, an output signal value 24a corresponding to an input signal value 23a in the operation start state, i.e., an original output signal value, is recorded (step D1). An input signal 23b is then produced according to the change in signal at the first clock, i.e., the change in signal caused by application of the input instruction in. The input signal 23b thus produced is applied to the logic circuit block (step D2). An output signal value 24b at the first clock is then recorded (step D3), and the recorded output signal sequence is examined in order to determine whether a new output instruction is generated or not (step D4). A corresponding output signal has not yet been recognized. Thereafter, a response signal ack of the input instruction in is examined (step D5). The response signal ack has not yet changed. In step D6, it is determined whether the logic circuit block has reached the end state or not. Since the change in input signal has not been completed, the routine proceeds to step D7 (NO in step D6). In step D7, operation of one clock is executed and the internal register value is updated to an internal register value 25c in order to change the state. It should be noted that the internal register values 25a, 25b in FIG. 25 are register values in the operation start state.

The routine then returns to step D2, and steps D2 to D7 are repeatedly conducted on a clock-by-clock basis. Since the output signal oe2 changes to "1" at the second clock, an output instruction oe2 is recognized. The output instruction oe2 is therefore extracted in step D4 at the second clock. Since a response signal ack2 of the recognized output instruction oe2 has a timing "x+1", the input signal ack2 is changed to "1" at the earliest timing (i.e., after one cycle). More specifically, the input signal ack2 is changed to "1" in step D2 at the third clock, and changed back to "0" in step D2 at the fourth clock. An output signal dout as a parameter of the output instruction oe2 has a timing "$x+1", and "$x" (corresponding to the value "x" used to determine the timing of the response signal ack2 of the output instruction oe2) is set to "0". Therefore, in step D4 of the third cycle (one cycle after the output instruction oe2 is started), the output signal oe2 (i.e., "1") is extracted as an argument of the output instruction oe2. Note that, although the output signal oe2 is still "1" in the third cycle, this is not recognized as a new output instruction. The reason for this is as follows: the output instruction oe2 already recognized in the second cycle indicates that the output signal oe2 is held at "1" during a period "$x+1", and "$x" is set to "0". Therefore, the output signal oe2 is held at "1" until one clock after the output instruction oe2 is generated, that is, until the third cycle.

In step D5 of the third cycle, the response signal ack of the input instruction in is "1". Since the response signal ack of the input instruction in has a timing "x", "$x" (corresponding to the value "x" of the input instruction in) is set to "3". As a result, the input signal in is held at "1" until two cycles after the input instruction in is generated, that is, until the third clock. The input signal in is therefore set to "0" in step D2 of the fourth cycle. In step D6 of the fourth cycle, it is determined that the logic circuit block has reached the end state, and the change in input signal caused by the input instruction and the change in signal corresponding to the recognized output instruction have been completed. Therefore, the routine proceeds to step D8 (YES in step D6). In step D8, the operation end state is extracted as a second state, whereby the operation analysis process B4 is completed. Note that the extraction result in this example corresponds to the state 26d in FIG. 26 described below.

After the operation analysis process of step B4 is completed, the routine proceeds to step B5. In this way, steps B2 to B6 are repeatedly conducted according to the flowchart of FIG. 4 in order to extract operation of every input instruction. FIG. 26 shows the extraction result for each combination of input instruction and argument. More specifically, FIG. 26 shows instructions including arguments, and the resultant output instruction sequences. In the illustrated example, there is only one operation start state. Therefore, it is not necessary to distinguish between operation start state and operation end state, and the variables representing the state are omitted. Since there is no output instruction corresponding to the input instruction reset, the output instruction sequence of the state 26e in FIG. 26 is left blank.

Finally, in step B7, the operation model A3 of the logic circuit is produced based on the extracted operations. FIG. 27 shows an example of the operation model A3 produced in the present embodiment. The operation model A3 is herein described in C language. The operation model A3 in FIG. 27 includes declarations of functions for output instructions (first and second lines in FIG. 27), and functions corresponding to input instructions (fourth to sixteenth lines). A block module name is added to the function name of each input instruction in order to distinguish the functions from those of another block. Regarding the operation for each combination of operation start state and argument of input instruction, the same output instruction and a change in state variable are described collectively. Note that, in this example, there is only one operation start state. Therefore, no variable for identifying the state will be required.

As has been described above, according to the method for converting a logic circuit model in the present embodiment, the input/output instruction information A2 indicating the relation between input/output signal and input/output instruction of the logic circuit block is applied to the logic circuit model described at RT level. Even if the input/output instruction information A2 includes an output instruction having an input response signal and/or an input instruction having an output response signal, operation of the RT-level model A1 is extracted for every input instruction, facilitating production of a high abstraction-level operation model A3 for use in serial simulation including no concept of clock.

(Fourth Embodiment)

Hereinafter, the fourth embodiment of the present invention will be described with reference to FIG. 4 and FIGS. 28 to 35.

The first to third embodiments are inapplicable to the following cases: like a data read instruction, an output instruction fetches an input signal as a parameter and operation of the logic circuit block varies according to the fetched value; and like a data read instruction, an input instruction requires a return value. The reason for this is as follows: in the case where an output instruction fetches an input signal as a parameter, no further operation can be analyzed because the input signal value is not determined. As a result, the operation model A3 cannot be produced. Moreover, in the case where an input instruction requires a return value, the operation model A3 cannot be produced because the return value is unknown.

In the fourth embodiment of the present invention, a method for converting an RT-level model A1 of a logic circuit block into an operation model A3, which is applicable to the above cases, will be described.

An RT-level model A1 of a logic circuit block in FIG. 28 is converted in the fourth embodiment. FIG. 28 shows an example of the RT-level model A1 described in Verilog-HDL.

First, input/output instruction information A2 used in the present embodiment will be described with reference to FIG. 29. FIG. 29 shows an example of the input/output instruction information A2 in the fourth embodiment. The input/output instruction information A2 in FIG. 29 describes declarations of functions indicating input/output instructions ("function"), input/output signal name ("port"), relation between input/output signal and input/output instruction ("type"), and timing ("timing"). As shown in information 29b in FIG. 29, a signal dout of an input instruction out is an output signal, and "parameter" is declared for the signal dout. Therefore, the signal dout is regarded as a return value to the input instruction out. Since the timing of the return signal dout is "1", the signal value dout at one clock after the start of the input instruction out is used as a return value. As shown in information 29d, 29e, signals din, err of an output instruction rd are input signals, and "parameter" is declared for the signals din, err. Therefore, the signals din, err are regarded as return values to the output instruction rd. Since the timing of the return signals din, err is "1", the signal values din, err at one clock after the start of the output instruction rd are used as return values. In this case, the return values are not determined during the operation analysis. Therefore, operation is analyzed using not constants but variable values as the return values.

Figure 30:
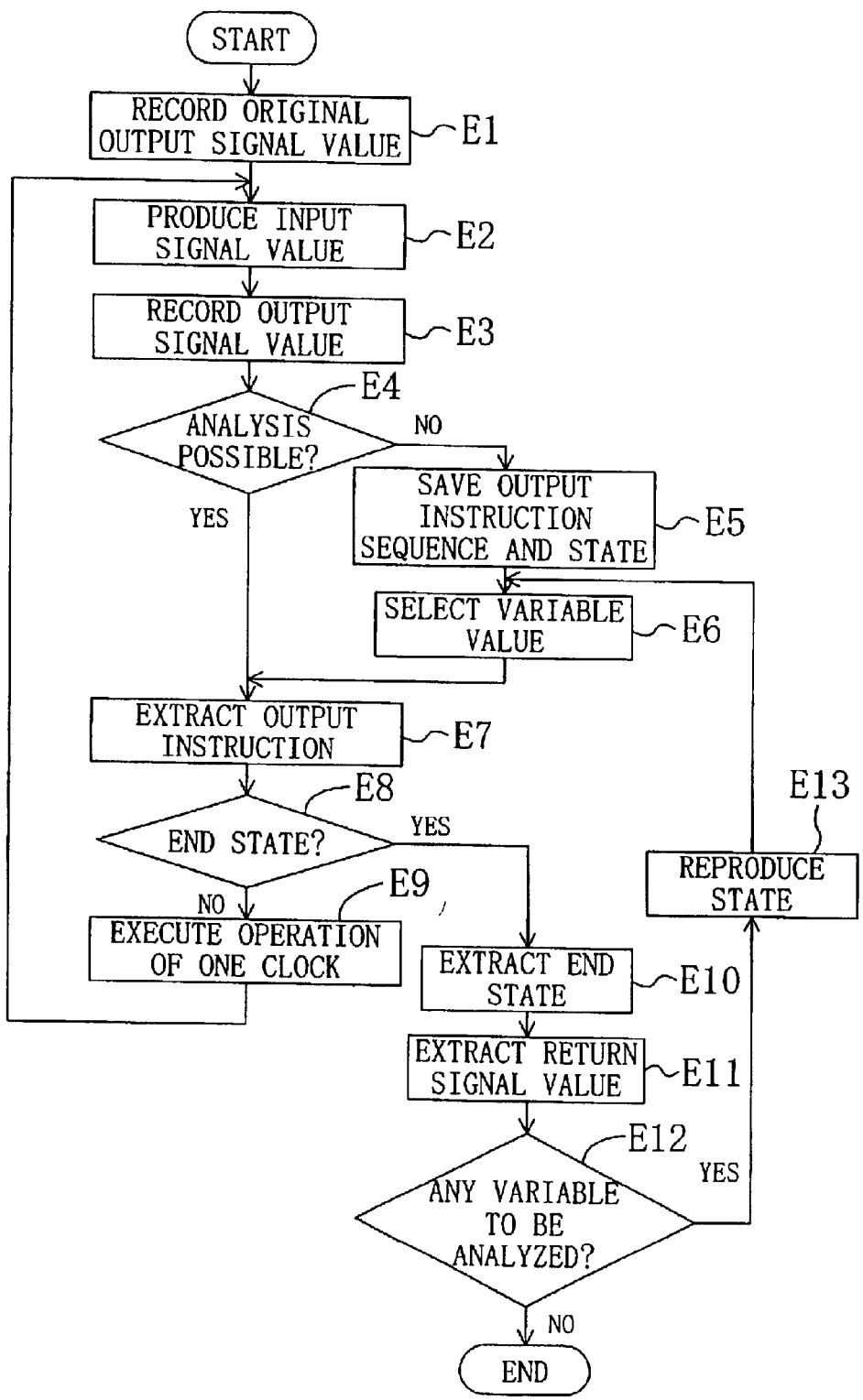
FIG. 30 is a flowchart illustrating a method for analyzing operation of a logic circuit model according to the fourth embodiment of the present invention.

Hereinafter, a description conversion method by the description converting means 1 will be described. The description conversion method of the fourth embodiment is the same as the method of FIG. 4 described in the above embodiments except the operation analysis process B4. Therefore, only the operation analysis process B4 is herein described with reference to FIG. 30. FIG. 30 is a flowchart illustrating the operation analysis process B4 of the present embodiment.

Referring to FIG. 30, in step E1, an output signal value in the absence of an input instruction, that is, an original output signal value, is recorded in the operation start state selected as a first state in step B3. In step E2, an input signal corresponding to one clock is produced as an input signal to the logic circuit block. Note that if an output instruction having a return value is extracted in step E7 described below, each input signal corresponding to the extracted output instruction is set to a variable value, based on the input/output instruction information A2. In step E3, an output signal value corresponding to the input signal value obtained in step E2 is added to an output signal sequence. If the input signals or the state variables representing the state of the logic circuit block are set to variable values, it is determined in step E4 whether operation of this clock can be analyzed with the variable values or not. If either an output signal value for determining whether an output instruction is generated or not in step E7 or a state variable for determining whether the logic operation state has reached the end state or not in step E8 is given by a variable value or an expression including a variable value, it is determined that operation cannot be analyzed. Even if the output signal or the state variable is set to a variable value, however, the same determination may be made in step E7 or E8 for every possible combination of the values of the variable values. In such a case, it can be determined in step E4 that operation can be analyzed.

If it is determined in step E4 that operation cannot be analyzed (NO in step E4), the output instruction sequence extracted so far and the current state of the block are saved in step E5. Thereafter, in step E6, one of the possible combinations of the values is selected for the variable values that make the operation analysis impossible, and these variable values are set to the selected values. The routine then proceeds to step E7. If it is determined in step E4 that operation can be analyzed (YES in step E4), the routine proceeds directly to step E7. In step E7, a new output instruction is extracted based on the output signal sequence, and the routine then proceeds to step E8.

In step E8, it is determined whether the logic circuit block has reached the end state or not. If it is determined that the logic circuit block has reached the end state (YES in step E8), the routine proceeds to step E10. Otherwise (NO in step E8), the routine proceeds to step E9. In step E9, operation of one clock is executed in order to update the state of the logic circuit block, and the routine then returns to step E2. Steps E2 to E9 are then repeatedly conducted, and operation is analyzed by the process described below. Note that each state variable may be given by a variable value or an expression including a variable value.

In step E10 (YES in step E8), the operation end state that the logic circuit block has reached in step E8 is extracted as a second state. In step E11, a signal value as a return value to the input instruction is extracted based on the output signal sequence. In step E12, it is determined whether or not every combination of the values has been selected for the variable values in step E6. If every combination of the values has been selected (NO in step E12), the operation analysis process is completed. Otherwise (YES in step E12), the routine proceeds to step E13. In step E13, the state saved in step E5 is reproduced, and the routine returns to step E6. In step E6, another combination of the values is selected for the variable values and operation is analyzed. In this way, steps E2 to E13 are repeatedly conducted according to the flowchart of FIG. 30 until it is determined in step E12 that every combination of the values has been selected for the variable values (NO in step E12). Finally, the operation analysis process B4 is completed.

Hereinafter, the process of producing the operation model A3 by the description converting means 1 will be specifically described. The description converting means 1 herein produces the operation model A3 based on the RT-level model A1 in FIG. 28 and the input/output instruction information A2 in FIG. 29.

In step B1, the description converting means 1 sets operation start states and operation end states according to the method of FIG. 5. More specifically, the description converting means 1 obtains steady states of the logic circuit block in the same manner as that of the above embodiments. The description converting means 1 then extract the state where every input signal value and every register value of the RT-level model A1 of FIG. 28 is "0". In the illustrated example, this state is set as an operation start state and an operation end state. In step B2, the description converting means 1 selects one input instruction from the input/output instruction information A2 in FIG. 29. It is herein assumed that the description converting means 1 selects only an input instruction out of information 29a in FIG. 29 as an instruction to be analyzed. Since only one state is set as an operation start state in step B1, the description converting means 1 selects that state as a first state in step B3. In step B4, the description converting means 1 analyzes operation of the RT-level model A1 (FIG. 28) for the input instruction out according to the operation analysis method in FIG. 30.

Figure 31:
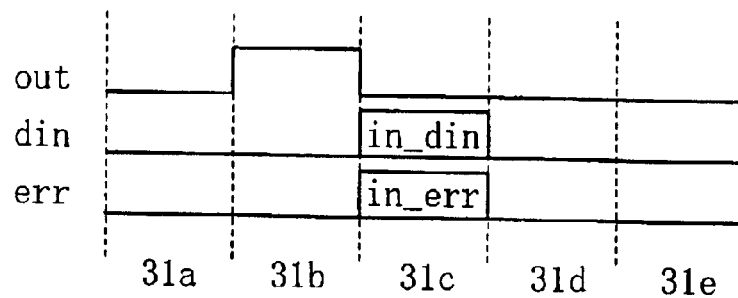
FIG. 31 shows input signals corresponding to an input instruction out according to the fourth embodiment of the present invention.
Figure 32:
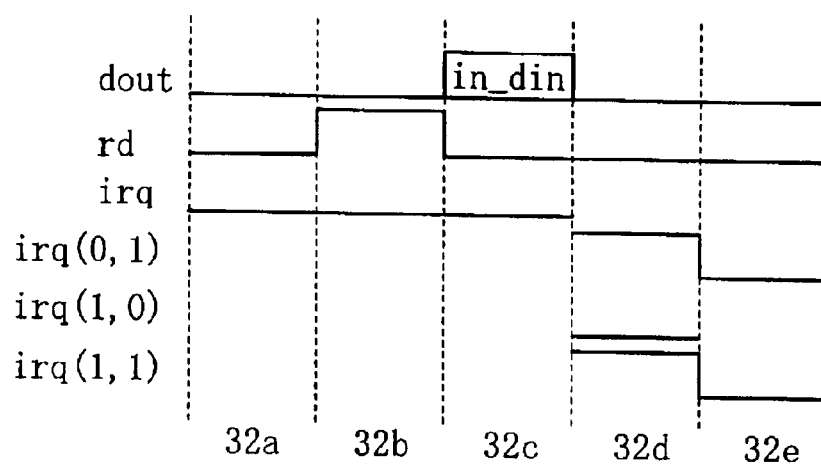
FIG. 32 shows output signals corresponding to the input instruction out according to the fourth embodiment of the present invention.
Figure 33:
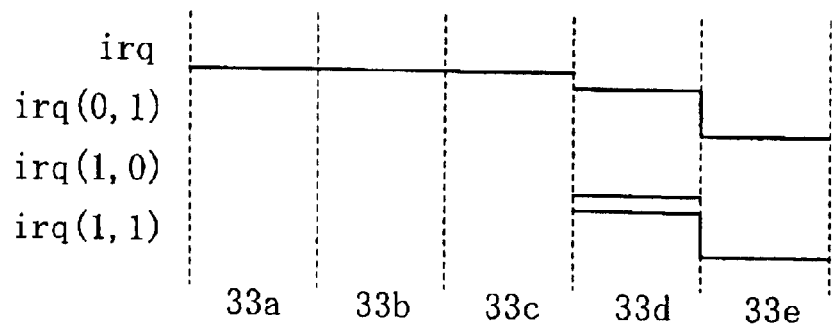
FIG. 33 shows a register value corresponding to the input instruction out according to the fourth embodiment of the present invention.

Hereinafter, the operation analysis process in step B4 will be specifically described with reference to FIG. 30 and FIGS. 31 to 34. FIG. 31 shows input signals produced during the process, FIG. 32 shows output signals, and FIG. 33 show an internal register value.

First, an output signal value 32a corresponding to an input signal value 30a in the operation start state, i.e., an original output signal value, is recorded (step E1). An input signal 31b is then produced according to the change in signal at the first clock, i.e., the change in signal caused by the input instruction out. The input signal 31b thus produced is applied to the logic circuit block (step E2). An output signal value 32b at the first clock is then recorded (step E3), and it is determined whether the operation analysis can be continued or not (step E4). Since there is neither state variable nor output signal having a variable value, the process proceeds to step E7 (YES in step E4). In step E7, whether a new output instruction is generated or not is determined based on the recorded output signal sequence. In the illustrated example, the output signal rd changes to "1" at the first clock. Therefore, an output instruction rd is recognized.

In step E8, it is determined whether the logic circuit block has reached the end state or not. Since the change in signal corresponding to the input instruction out has not been completed, the routine proceeds to step E9 (NO in step E8). In step E9, operation of one clock is executed and the internal register value is updated to an internal register value 33c in order to change the state. The routine then returns to step E2. It should be noted that internal register values 33a, 33b in FIG. 33 are register values in the operation start state.

Thereafter, steps E2 to E9 are repeatedly conducted. In the illustrated example, the output instruction rd is recognized at the first clock. The output instruction rd has input signals din, err which use a return value as a parameter at the second clock. Therefore, in step E2 of the second clock, the input signals din, err are set to variable values in_din, in_err. As a result, the output signal dout having a variable value is recorded in step E3. In step E4, it is determined whether operation can be analyzed or not. At the second clock, both the state required to determine whether the logic circuit block has reached the operation end state or not and the input signals have a variable value. Therefore, it is determined that operation cannot be analyzed, and the routine proceeds to step E5 (NO in step E4). The current state and the output instruction sequence extracted so far are saved in step E5. In step E6, one of the possible combinations of the values is selected for the variable values in_din, in_err, and the routine then proceeds to step E7. It is herein assumed that both variable values in_din, in_err are set to "0". In this case, a new output instruction is not extracted in step E7.

In step E8, it is determined that the logic circuit block has reached the end state, and the routine proceeds to step E10 (YES in step E8). In step E10, the operation end state is extracted as a second state. In step E11, the signal dout of the second clock is extracted as a return value to the input instruction out. Referring to FIG. 32, the signal dout is set to a variable value in_din at the second clock. Since the variable value in_din is set to "0" in step E6, the return value is "0". Note that the extraction result in this example corresponds to the state 34a in FIG. 34 described below.

The routine then proceeds to step E12. Since not every combination of the values has been selected for the variable values in_din, in_err, the routine proceeds to step E13 (YES in step E12). In step E13, the state saved in step E5 is reproduced, and the routine then returns to step E6. In step E6, another combination of the values is selected for the variable values in_din, in_err. It is herein assumed that the variable value in_din is set to "0" and the variable value in_err is set to "1". As a result, an output instruction irq is recognized at the fourth clock. At the fifth clock, it is determined that the logic circuit block has reached the end state.

Thereafter, the above operation is repeatedly conducted for every possible combination of the variable values, and the operation analysis process B4 is completed. As a result, the operation analysis result of FIG. 34 is obtained. FIG. 34 shows an output instruction sequence before generation of the branch by the variable values, combination of variable values upon generation of the branch, an output instruction sequence after generation of the branch, and a return value to the input instruction. Note that only one branch is generated by the variable values in the present embodiment. However, the operation analysis process of the present embodiment can be similarly conducted even when two or more branches are generated.

In the present embodiment, there is only one operation start state and only one input instruction. Therefore, after the operation analysis process B4 is completed, the routine proceeds to step B5, step B6 and then step B7. Finally, in step B7, the operation model A3 of the logic circuit block in FIG. 35 is produced based on the operation analysis result in FIG. 34. FIG. 35 shows an example of the operation model A3 described in C language. The operation model A3 in FIG. 35 includes declarations of functions for the output instructions (first and second lines in FIG. 35), and functions corresponding to the input instruction (fourth to twenty-fourth lines). A block module name is added to the function name of each instruction in order to distinguish the functions from those of another block. In the operation model A3 of FIG. 35, the return value of each function is transferred using a pointer to a variable used as an argument of the function. The sixth line in FIG. 35 is a declaration of variables for which the return values of the output instruction are substituted.

As has been described above, according to the method for converting a logic circuit model in the present embodiment, the input/output instruction information A2 indicating the relation between input/output signal and input/output instruction of the logic circuit block is applied to the logic circuit model described at RT level. Even if the input/output instruction information A2 includes an output instruction having a return signal and/or an input instruction having a return signal, operation of the RT-level model A1 is extracted for every input instruction, facilitating production of a high abstraction-level operation model A3 for use in serial simulation including no concept of clock.

It should be understood that combination of the present embodiment and the third embodiment would allow the RT-level model A1 to be converted into the operation model A3 even if there is an input/output instruction having both a return signal and a response signal.

In the operation analysis process of the present embodiment, only the return values of the output instructions are set to variable values. However, an argument of an input instruction may be set to a variable value so that operation for the input instruction having different argument values can be simultaneously analyzed. Alternatively, one or more of the variables representing the state of the logic circuit block may be set to a variable value in order to integrate a plurality of operation start states into one operation start state. As a result, operations for the plurality of operation start states can be analyzed simultaneously.

(Fifth Embodiment)

Hereinafter, the fifth embodiment of the present invention will be described with reference to FIGS. 2, 4, 6, 19 and FIGS. 36 to 40.

In the above embodiments, every state variable of the logic circuit block is used to set the operation start states and operation end states. Therefore, if there are a large number of state variables, the logic circuit block would have an extremely large number of states. In this case, an extremely large amount of operation may be required to extract the steady states described in the first embodiment. Moreover, since it is necessary to set a large number of operation start states, a large amount of operation may be required to extract the operation.

In the fifth embodiment of the present invention, a method for converting an RT-level model A1 into an operation model A3 with a reduced amount of operation will be described. This is realized by reducing the number of state variables required to set the operation start states and operation end states.

It is herein assumed that the operation model A3 is produced according to the flowcharts of FIGS. 4 and 6.

In the present embodiment, only control variables are extracted from the state variables of the logic circuit block in order to set the operation start states and operation end states.

Figure 36:
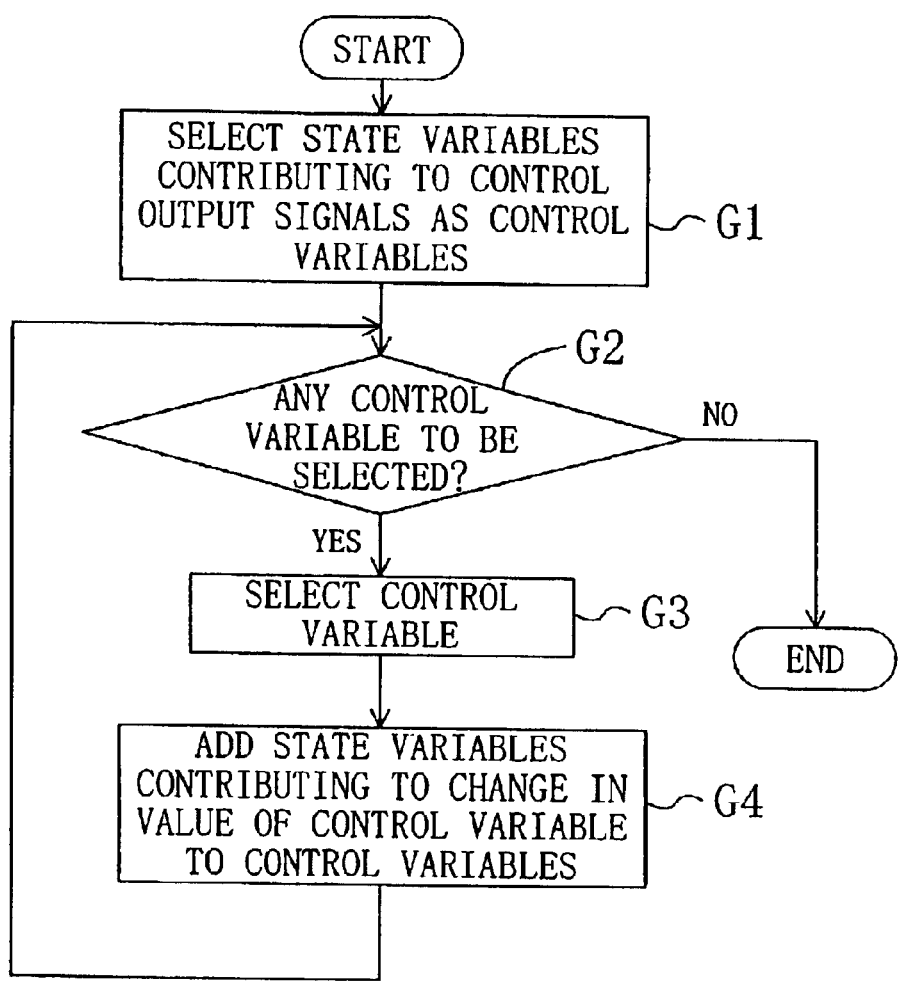
FIG. 36 is a flowchart illustrating a method for selecting control variables from state variables according to the fifth embodiment of the present invention.

A method for extracting control variables from the state variables will be described with reference to FIG. 36. FIG. 36 is a flowchart illustrating a method for selecting control variables from the state variables (input signals and registers) according to the present embodiment. In step G1, variables contributing to any control output signal value are selected as control variables from the state variables. The "control output signal" herein refers to an output signal whose change in value is associated with generation of an output instruction in the input/output instruction information A2. The control output signal does not include an output signal used as a parameter of an output instruction or a return value of an input instruction.

In step G2, it is determined whether or not every control variable extracted in step G1 or step G4 has been selected in step G3. If there is any control variable that has not been selected in step G3, the routine proceeds to step G3 (YES in step G2). Otherwise, the routine is completed (NO in step G2). In step G3, one of the non-selected control variables is selected. In step G4, the RT-level model A1 is analyzed, and state variables that contribute to a change in value of the control variable selected in step G3 in operation of one clock are extracted. If the extracted state variables are not included in the control variables, they are added to the control variables. The routine then returns to step G2.

Thereafter, steps G2 to G4 are repeatedly conducted until it is determined in step G2 that every control variable has been selected (NO in step G2). The state transition represented by the control variables thus obtained in the above method is not affected by the values of other state variables. In steps G1, G4, if a signal used as an input parameter is present among the signals contributing to the value of the control output signals or the control variables, such a signal is extracted as a control parameter.

Only the control variables extracted by the above method are used to set the operation start states and operation end states in step B1. Note that the operation start states and operation end states may be set by extracting steady states from the states represented by the control variables according to the method of the first embodiment. Alternatively, the operation start states and operation end states may be set manually. Since the state variables other than the control variables do not affect the control variables, the steady states can be extracted based only on the control variables.

Thereafter, steps B2 to B7 are repeatedly conducted for the operation start states and operation end states, whereby the operation model A3 is produced.

It should be noted that, if there is any input parameter that is not included in the control parameters, each value of such an input parameter will not be regarded as a different instruction in step B2, and operation is analyzed with the input parameter being set to a variable value. Moreover, a variable value is assigned to the state variables other than the input signals having a fixed value and the control variables in order to collectively select a plurality of states in step B3. Regarding the state variables or parameters that are given by variable values, the variable values are used in each step of the operation analysis process B4. As a result, a parameter value of the output instruction extracted in step C8 of FIG. 6 and a register value updated in step C6 may be given by an expression represented with one or plurality of variables, not by a constant. It should be noted that, since the control parameters and the initial control variables are not given by variable values, the control output signals and the control variables will not be given by a variable value. Accordingly, no variable value will be involved in determining whether an output instruction is generated or not in step C8 and in determining whether the logic circuit block has reached the end state or not in step C5. This ensures that the determination will always be conducted successfully.

Hereinafter, the process of producing the operation model A3 by the description converting means 1 will be described specifically. The description converting means 1 herein produces the operation model A3 by using the RT-level model A1 in FIG. 2 and the input/output instruction information A2 in FIG. 13.

In step B1 in FIG. 4, the description converting means 1 sets operation start state and operation end states. The description converting means 1 first selects control variables according to the flowchart of FIG. 36. In step G1, the description converting means 1 extract output signals oe1, oe2 (i.e., signals associated with generation of an output instruction) from the input/output instruction information A2 in FIG. 13 as control output signals, and then selects state variables oe1, oe2 contributing these signals as control variables. Since the control variables oe1, oe2 have not been selected in step G2, the routine proceeds to step G3 (YES in step G2). In step G3, the description converting means 1 first selects the control variable oe1. The description converting means 1 then analyses the RT-level model A1 in FIG. 2. Since the control variable oe1 is updated at every clock (tenth line in FIG. 2), variables sel, ff_in contributing to this updating are added to the control variables (step G4).

The routine then returns to step G2, and steps G2 to G4 are repeatedly conducted until every control variable is selected (NO in step G2). As a result, state variables oe1, oe2, sel, ff_in are selected as control variables. Note that a state variable dout is not associated with generation of an output instruction. Therefore, the state variable dout is not selected as a control variable. Moreover, an input parameter din does not contribute to the value of the control variables. Therefore, the input parameter din is not selected as a control parameter. As shown in the first embodiment, after the steady states are obtained in step B1, one of the steady states, a state having the selected four control variables being set to zero, is selected. Accordingly, in step B1, the description converting means 1 sets this state as an operation start state and an operation end state.

In step B2, the description converting means 1 selects one instruction from the input/output instruction information A2 in FIG. 13. In the illustrated example, the only input instruction in is selected. Of the arguments of the selected input instruction in, the input parameter din is not a control parameter, whereas the input parameter sel is a control parameter. Therefore, the input parameter din is set to a variable value in_din, and each value of the input parameter sel is regarded as a different instruction. In this example, "1" is selected as a value of the control parameter sel. In step B3, the description converting means 1 selects one of the operation start states obtained in step B1. Since there is only one operation start state, the description converting means 1 selects this state as a first state. The state variable dout is set to a variable value dout. In step B4, the description converting means 1 analyzes operation of the RT-level model A1 in FIG. 2 for the input instruction in.

Figure 37:
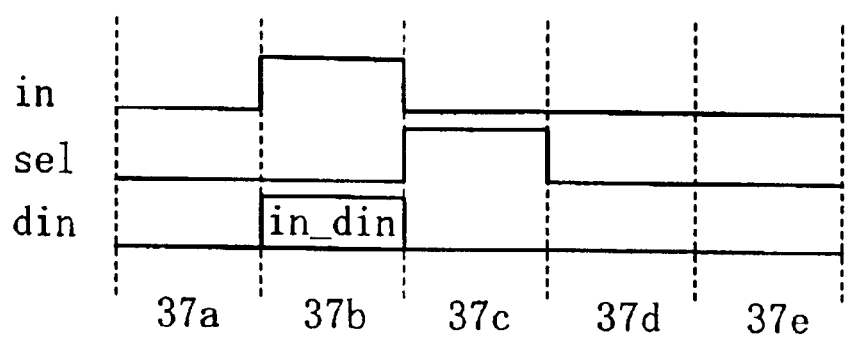
FIG. 37 shows input signals corresponding to an input instruction in according to the fifth embodiment of the present invention.
Figure 38:
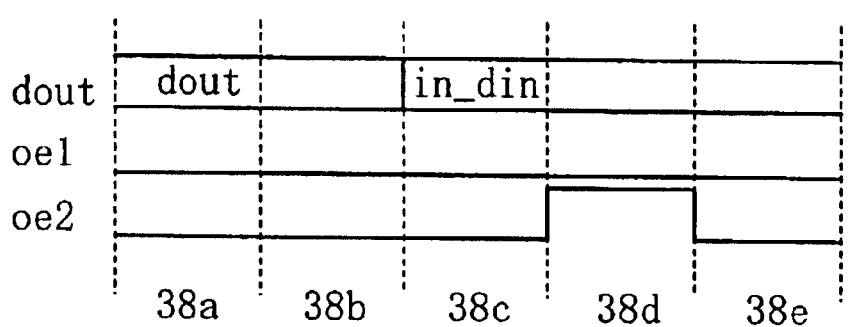
FIG. 38 shows output signals corresponding to the input instruction in according to the fifth embodiment of the present invention.
Figure 39:
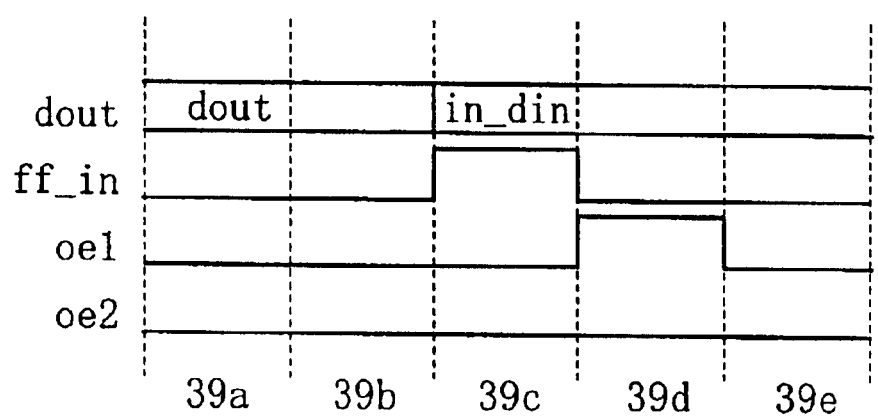
FIG. 39 shows register values corresponding to the input instruction in according to the fifth embodiment of the present invention.

Hereinafter, the operation analysis process B4 will be described with reference to FIG. 6 and FIGS. 37 to 40. FIG. 37 shows input signals produced during the process, FIG. 38 shows output signals, and FIG. 39 shows internal register values.

First, an input signal is produced using both a change in input signal caused by the input instruction in selected in step B2 (i.e., the input instruction to be analyzed) and an input signal value in the operation start state (step C1). In FIG. 37, 37a denotes an input signal value before application of the input instruction in, 37b denotes an input signal value at the first clock upon application of the input instruction in, and 37c denotes an input signal value at the second clock. Since the argument of the input signal din is given by a variable value, the input signal din has a variable value in_din at the first clock (input signal 37b).

Thereafter, an original output signal value 38a corresponding to the input signal value 37a is recorded (step C2). Since a state variable corresponding to the register dout is given by a variable value dout, the output signal dout has a variable value dout. The input signal value is then updated to the input signal value 37b (step C3), and the output signal value 38b at the first clock is recorded (step C4). In step C5, the current input signal value and the current state are examined. Since the change in input signal caused by the input instruction in is not completed at the first clock, it is determined that the logic circuit block has not reached the end state, and the routine proceeds to step C6 (NO in step C5). In step C6, operation of one clock is executed in order to change the state. More specifically, in step C6, the internal register value is changed to the internal register value 39c. The routine then returns to step C3. It should be noted that the internal register values 39a, 39b in FIG. 39 are register values in the operation start state.

Thereafter, steps C3 to C6 are repeatedly conducted until the logic circuit block reaches the end state in step C5. In step C5 of the fourth clock, the change in signal caused by the input instruction in has been completed. Moreover, the control variables in the input signal value 37e and the register value 39e match the operation end state as a second state. Therefore, it is determined that the logic circuit block has reached the end state, and the routine proceeds to step C7 (YES in step C5). In step C7, the operation end state of the logic circuit block is extracted.

Finally, in step C8, the output signal sequence of FIG. 38 recorded in steps C2, C4 is compared with an output signal pattern of the output instructions defined by the input/output instruction information A2 of FIG. 13. In FIG. 38, the output signal oe2 is set to "1" at the third clock (output signal value 38d). This corresponds to an output instruction oe2. Therefore, the output instruction oe2 is extracted in step C8. Moreover, the output instruction oe2 uses the output signal dout as an argument, and the output signal dout has timing "1". As can be seen from the output signal value 38e, the output signal dout has a variable value in_din at the fourth clock (i.e., one clock after the output signal oe2 is set to "1"). Therefore, the variable value in_din is used as an argument of the output instruction oe2. The extraction result in this example corresponds to the extraction result 40b in FIG. 40 described below.

The operation analysis result in FIG. 40 is thus obtained by the operation analysis process B4. FIG. 40 shows the analysis result for the input instruction in. More specifically, FIG. 40 shows the input instruction including an argument, the output signal dout in the operation start state, the output signal dout after execution of the instruction, and the extracted output instruction sequence. Note that the input signals in, sel, din and the register values ff_in, oe1, oe2 are omitted because each has the same value in every operation start state and every operation end state.

After the operation analysis process B4 is completed, the routine proceeds to step B5. Since there is only one operation start state and only one input instruction in the present embodiment, the routine then proceeds to step B6 and step B7. Finally, in step B7, the operation model A3 is produced based on the operation analysis result of FIG. 40. It is herein assumed that the operation model A3 in FIG. 19 is produced as in the second embodiment. Note that, although the same operation model A3 as the second embodiment is produced in the present embodiment, the steady states do not necessarily have the same values after execution of the instruction.

As has been described above, when a logic circuit model described at RT level is converted into a high abstraction-level operation model A3 according to the method of the present embodiment, state variables that affect an output signal used to recognize an output instruction are selected as control variables. Moreover, state variables that affect a change in control variable are also added to the control variables. In the step of setting the operation start states and operation end states, every state where all or at least one of the control variables has the same value is regarded as a single state. This enables reduction in the number of operation start states and operation end states, and thus enables reduction in the amount of operation required to select an operation start state and the like and to analyze operation of the RT-level model A1 of the logic circuit block.

In the method of the present embodiment, the RT-level model A1 of a logic circuit block having neither response signal nor return signal is converted into the operation model A3. However, combination of the method for setting operation start states and operation end states in the present embodiment and the operation analysis method of the third or fourth embodiment would allow the number of operation start states and operation end states to be reduced even when the RT-level model A1 of a logic circuit block having a return signal and/or a response signal is converted into the operation model A3.

What is claimed is:

1. A method for converting an RT (Register Transfer)-level model of a logic circuit block into a high abstraction-level operation model, comprising the steps of:

setting one or more states of the logic circuit block as operation start states and operation end states by using input/output instruction information that represents a relation between an input/output instruction of the logic circuit block and an input/output signal corresponding to the input/output instruction; and analyzing operation of the logic circuit block, the operation analyzing step being conducted by selecting one input instruction to be analyzed from those included in the input/output instruction information, applying an input signal corresponding to the selected input instruction to the RT-level model that is in a first state selected from the operation start states, and analyzing the RT-level model and extracting an operation of the logic circuit block by varying the input signal, until the RT-level model reaches a second state of the operation end states, wherein the operation analyzing step is repeatedly conducted for at least one or all combinations of the operation start state and the input instruction included in the input/output instruction information, and the operation model of the logic circuit block is produced based on the extracted operations.

2. The method according to claim 1, wherein the operation analyzing step includes the steps of producing a time series of one or more input signals corresponding to the instruction to be analyzed, producing a time series of an output signal by executing the RT-level model using the time series of the input signals until the RT-level model reaches the second state, extracting a state where the RT-level model reaches the second state as an operation of the logic circuit block, and comparing the time series of the output signal with the relation between an output instruction and an output signal corresponding thereto as defined in the input/output instruction information, and extracting the output instruction from those included in the input/output instruction information as an operation of the logic circuit block.

3. The method according to claim 1, wherein the operation analyzing step includes the steps of producing at every clock one or more input signals corresponding to an input instruction included in the instruction to be analyzed, executing the RT-level model at every clock using the input signals, and producing an output signal at every clock, extracting at every clock a state where the RT-level model reaches the second state as an operation of the logic circuit block, and comparing the output signal with the relation between an output instruction and an output signal corresponding thereto as defined in the input/output instruction infromation, and extracting at every clock the output instruction from those included in the input/output instruction information as an operation of the logic circuit block.

4. The method according to claim 3, wherein the input/output instruction information includes as an output instruction an output instruction with a response signal, the output instruction with the response signal being an instruction having both an output signal and an input signal associated therewith as a response signal thereof, and in the operation analyzing step, when the output instruction with the response signal is extracted at one clock, operation of the RT-level model at a clock later than the one clock is analyzed by using the response signal produced by varying a value of the response signal corresponding to the output instruction with the response signal at a timing designated by the input/output instruction information.

5. The method according to claim 3, wherein the input/output instruction information includes as an input instruction an input instruction with a response signal, the input instruction with the response signal being an instruction having both an input signal and an output signal associated therewith as a response signal thereof, and in the operation analyzing step, when the input instruction with the response signal is selected at one clock as the instruction to be analyzed, operation of the RT-level model at a clock later than the one clock is analyzed by using the response signal produced based on a value of the response signal corresponding to the input instruction with the response signal, which varies at a timing designated by the input/output instruction information.

6. The method according to claim 3, wherein the input/output instruction information includes as an output instruction an output instruction with a return value, the output instruction with the return value being an instruction having an input signal associated therewith as a return value, and in the operation analyzing step, when operation of the RT-level model varies according to a value of the input signal serving as the return value of the output instruction, operation of the RT-level model is analyzed for every possible combination of values of the return value.

7. The method according to claim 3, wherein the input/output instruction information includes as an input instruction an input instruction with a return value, the input instruction with the return value being an instruction having an output signal associated therewith as a return value, and in the operation analyzing step, a value of the output signal at a clock designated by the input/output instruction information is extracted as the return value of the input instruction, and operation of the RT-level model is analyzed based on the extracted value.

8. The method according to claim 1, wherein, in the state setting step, a state where a state of the logic circuit block does not change in the absence of an input instruction or a state where a finite number of states of the logic circuit block are repeated in the absence of an input instruction are set as the operation start states and the operation end states.

9. The method according to claim 1, wherein, of state variables specifying a state of the logic circuit block, any state variable that affects an output signal used to recognize an output instruction included in the input/output instruction information is selected as a control variable, and one or more states specified by the selected control variable are set as the operation start states and the operation end states in the state setting step.

10. The method according to claim 9, wherein, of the one or more states designated by the control variable, states where all or at least one of the control variables have the same value are regarded as a single state when the operation start states and the operation end states are set in the state setting step.

11. The method according to claim 9, wherein, in the state setting step, any state variable that contributes to updating of the control variable in one-clock operation of the RT-level model is also selected as the control variable.

* * * * *